United States Patent
Park et al.

(10) Patent No.: US 10,685,713 B2
(45) Date of Patent: Jun. 16, 2020

(54) STORAGE DEVICE INCLUDING NONVOLATILE MEMORY DEVICE AND CONTROLLER

(71) Applicant: Samsung Electronics Co., Ltd., Suwon-si, Gyeonggi-do (KR)

(72) Inventors: Jooyong Park, Bucheon-si (KR); Jin-Young Kim, Seoul (KR); Kuihan Ko, Seoul (KR); Han Il Park, Suwon-si (KR); Bongsoon Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/163,968

(22) Filed: Oct. 18, 2018

(65) Prior Publication Data

US 2019/0333586 A1 Oct. 31, 2019

(30) Foreign Application Priority Data

Apr. 25, 2018 (KR) .......................... 10-2018-0048101

(51) Int. Cl.
| | | |
|---|---|---|
| G11C 16/04 | (2006.01) | |
| G11C 16/14 | (2006.01) | |
| G06F 3/06 | (2006.01) | |

(52) U.S. Cl.
CPC .............. G11C 16/14 (2013.01); G06F 3/064 (2013.01); G06F 3/0622 (2013.01); G06F 3/0652 (2013.01); G06F 3/0679 (2013.01)

(58) Field of Classification Search
CPC ..................................................... G11C 16/22
USPC ..................................................... 365/185.04
See application file for complete search history.

(56) References Cited

U.S. PATENT DOCUMENTS

| | | | |
|---|---|---|---|
| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,891,300 | B2 | 11/2014 | Oh et al. |
| 2005/0228938 | A1 | 10/2005 | Khare et al. |
| 2011/0233648 | A1 | 9/2011 | Seol et al. |
| 2013/0019054 | A1 | 1/2013 | Jung et al. |
| 2014/0136579 | A1 | 5/2014 | Nakashima |

(Continued)

FOREIGN PATENT DOCUMENTS

| | | |
|---|---|---|
| JP | 2015-204072 A | 11/2015 |
| JP | 2017-059281 A | 3/2017 |

*Primary Examiner* — Hoai V Ho
(74) *Attorney, Agent, or Firm* — Harness, Dickey and Pierce, P.L.C.

(57) ABSTRACT

A storage device includes a nonvolatile memory device that includes memory blocks, each including memory cells, and a controller that receives a first write request from an external host device. Depending on the first write request, the controller transmits a first sanitize command to the nonvolatile memory device and transmits first write data and a first write command associated with the first write request to the nonvolatile memory device. The nonvolatile memory device is configured to sanitize first data previously written to first memory cells of a first memory block of the memory blocks in response to the first sanitize command. The nonvolatile memory device is further configured to write the first write data to second memory cells of the first memory block in response to the first write command.

20 Claims, 19 Drawing Sheets

(56) References Cited

U.S. PATENT DOCUMENTS

2015/0149740 A1    5/2015  Shin et al.
2018/0005700 A1*  1/2018  Kang ..................... G11C 16/16
2019/0087110 A1*  3/2019  Li ....................... G11C 11/5628

* cited by examiner

STORAGE DEVICE INCLUDING NONVOLATILE MEMORY DEVICE AND CONTROLLER

CROSS-REFERENCE TO RELATED APPLICATIONS

This application claims priority under 35 U.S.C. § 119 to Korean Patent Application No. 10-2018-0048101 filed on Apr. 25, 2018, in the Korean Intellectual Property Office, the disclosure of which is incorporated by reference herein in its entirety.

BACKGROUND

Example embodiments of the inventive concepts described herein relate to a semiconductor device. For example, at least some example embodiments relate to a storage device including a nonvolatile memory device and a controller.

A storage device stores data in a nonvolatile memory device such as a phase change memory device, a ferroelectric memory device, a resistive memory device, or a magnetic memory device. The storage device is used in various user devices such as a smartphone, a smart pad, and a personal computer.

As semiconductor manufacturing technologies develop, the degree of physical integration of the nonvolatile memory device is improved, and thus, the capacity of the storage device is increasing. In particular, as the nonvolatile memory device is manufactured in a three-dimensional structure, the degree of physical integration of the nonvolatile memory device is markedly being improved.

Also, as the number of bits stored in one memory cell of the nonvolatile memory device increases, the degree of data integration of the storage device is being improved. The increase in the degree of physical integration and the degree of data integration may cause an increase in the capacity of the storage device and a decrease in manufacturing costs.

However, the improvement of the degree of the physical integration and the degree of data integration may cause an increase in a stress applied to the nonvolatile memory device upon accessing the nonvolatile memory device and/or may reduce a lifespan of the nonvolatile memory device or the storage device.

SUMMARY

Example embodiments of the inventive concepts provide a storage device having an improved lifespan.

According to an example embodiment, a storage device includes a controller configured to, receive a first write request from an external host device, and transmit, based on the first write request, a first sanitize command, first write data and a first write command, the first write command being associated with the first write request; and a nonvolatile memory device including memory blocks having memory cells associated therewith. the nonvolatile memory device configured to, sanitize a first data previously written to first memory cells of a first memory block of the memory blocks in response to the first sanitize command received from the controller, and write the first write data to second memory cells of the first memory block in response to the first write command received from the controller.

According to an example embodiment, a storage device includes a nonvolatile memory device including first memory blocks and second memory blocks; and a controller configured to differently manage data written to the first memory blocks and the second memory blocks by, transmitting, to the nonvolatile memory device, a sanitize command associated with first data previously written to the first memory blocks and a write command for first update data upon updating the first data, the sanitize command instructing the nonvolatile memory device to increase threshold voltages of first memory cells in a first memory block selected from the first memory blocks, and transmitting, to the nonvolatile memory device, a write command associated with second update data upon updating second data written to the second memory blocks.

According to an example embodiment, a storage device includes a nonvolatile memory device including memory blocks each including memory cells; and a controller configured to, update first data previously written to a first memory block of the memory blocks using second data by, transmitting a sanitize command for the first data stored in the first memory block to the nonvolatile memory device, the sanitize command instructing the nonvolatile memory device to sanitize the first data such that after the first data are sanitized, the first data that has been sanitized occupies a capacity of the first memory block as invalid data, and transmitting a write command for the second data to the nonvolatile memory device such that a write operation is performed on the first memory block or a second memory block of the memory blocks.

BRIEF DESCRIPTION OF THE FIGURES

The above and other objects and features of example embodiments of the inventive concepts will become apparent by describing in detail some example embodiments thereof with reference to the accompanying drawings.

DETAILED DESCRIPTION

Below, some example embodiments of the inventive concepts may be described in detail and clearly to such an extent that an ordinary one in the art easily implements example embodiments of the inventive concepts.

Figure 1:
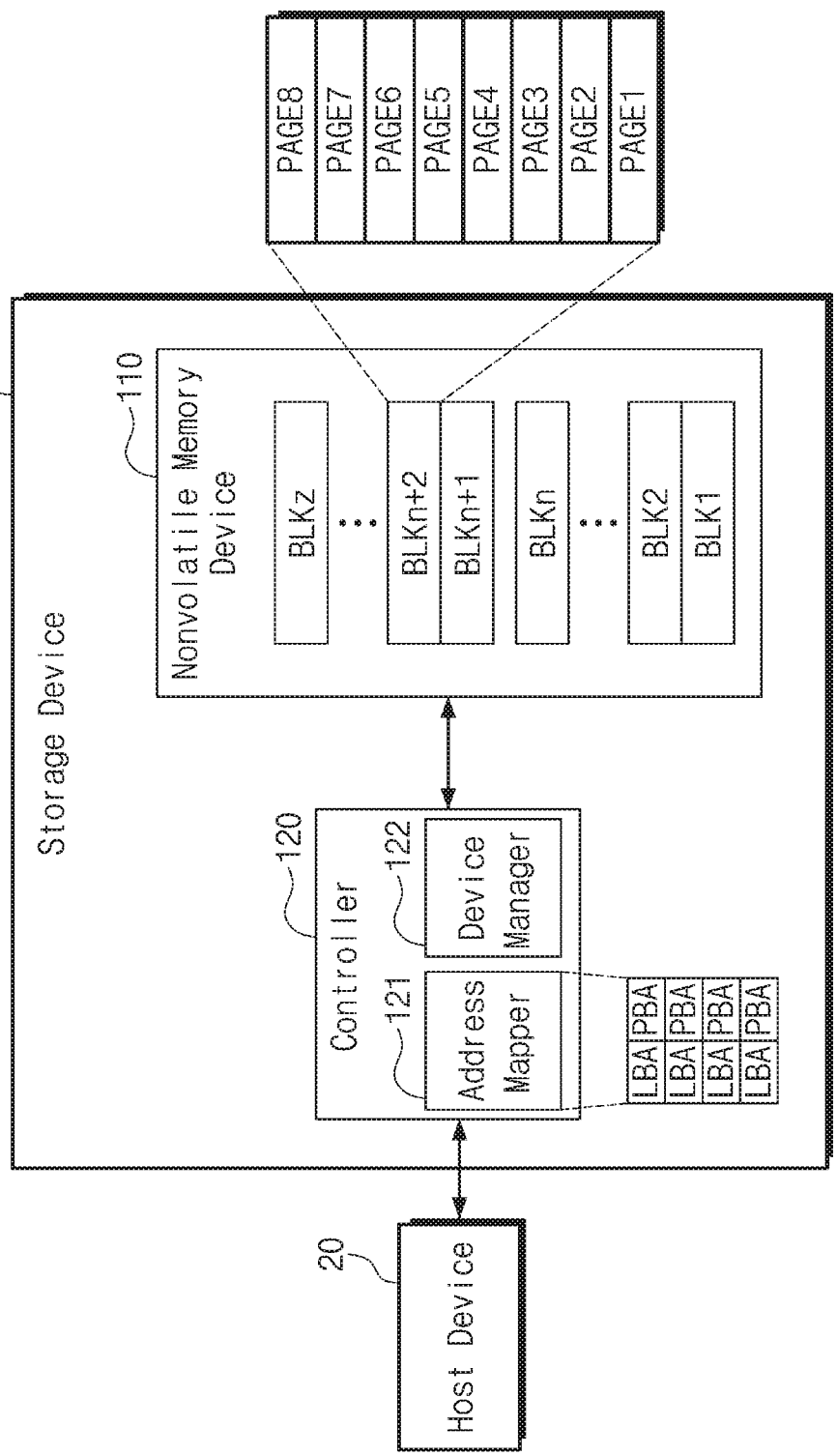
FIG. 1 is a block diagram illustrating a computing device according to an example embodiment of the inventive concepts.

FIG. 1 is a block diagram illustrating a computing device 10 according to an example embodiment of the inventive concepts.

Referring to FIG. 1, the computing device 10 includes a host device 20 and a storage device 100.

The host device 20 may execute various objects such as an operating system and an application. The host device 20 may access the storage device 100 depending on requests of the objects.

For example, the host device 20 may store write data in the storage device 100 by transmitting a write request including the write data to the storage device 100. The host device 20 may read data from the storage device 100 by transmitting a read request to the storage device 100. The host device 20 may transmit information about data deleted by the operating system or the application to the storage device 100.

The storage device 100 may operate in response to a request of the host device 20. The storage device 100 may perform a write operation in response to a write request of the host device 20 and may perform a read operation in response to a read request. The storage device 100 may perform an erase operation depending on delete information transmitted from the host device 20 and/or depending on internally managed metadata.

The storage device 100 includes a nonvolatile memory device 110 and a controller 120.

The nonvolatile memory device 110 may perform a write operation, a read operation, and/or an erase operation in response to a command from the controller 120. The nonvolatile memory device 110 may include a plurality of memory blocks BLK1 to BLKz. Each of the memory blocks BLK1 to BLKz may include memory cells.

The nonvolatile memory device 110 may write one or more bits to each memory cell through the write operation. The nonvolatile memory device 110 may read one or more bits from each memory cell through the read operation. The nonvolatile memory device 110 may erase bits stored in each memory cell through the erase operation.

In an example embodiment, memory cells of each of the memory blocks BLK1 to BLKz may be classified into pages PAGE1 to PAGE8. Each of the pages PAGE1 to PAGE8 may include two or more memory cells. For example, the nonvolatile memory device 110 may perform the write operation or the read operation in unit of page. The nonvolatile memory device 110 may perform the erase operation in unit of a memory block or in unit of a sub-block which includes two or more pages and belongs to the memory block.

The controller 120 may control the nonvolatile memory device 110. The controller 120 may transmit a write command, a read command, or an erase command to the nonvolatile memory device 110 in response to a request of the host device 20 or depending on an internal schedule for managing the storage device 100.

The controller 120 may include an address mapper 121 and a device manager 122. The address mapper 121 may map logical addresses LBA of the host device 20 onto physical addresses PBA of the memory blocks BLK1 to BLKz in the nonvolatile memory device 110. For example, the memory blocks BLK1 to BLKz may be classified into first memory blocks BLK1 to BLKn (e.g., user memory blocks) and second memory blocks BLKn+1 to BLKz (e.g., security memory blocks).

The controller 120 may determine whether a write request is associated with a security write operation. For example, write data, which may need a higher security level than any other data, such as a password may be determined as being associated with the security write operation. For example, the controller 120 may generate data (e.g., second write data) for the security write operation from data (e.g., first write data) received from the host device 20.

For example, the host device 20 may provide the storage device 100 with information providing notification that the write request is associated with the security write operation. The controller 120 may determine whether the write request is associated with the security write operation, depending on the information from the host device 20.

For another example, the host device 20 may not provide the storage device 100 with information providing notification that the write request is associated with the security write operation. The controller 120 may determine whether the write request is associated with the security write operation, depending on a pattern or characteristic of the write data transmitted from the host device 20 or depending on the context of pieces of data which the host device 20 previously writes to the storage device 100.

When the write request is not associated with the security write operation, the address mapper 121 may map the write data onto physical addresses PBA of the first memory blocks BLK1 to BLKn. When the write request is associated with the security write operation, the address mapper 121 may map the write data onto physical addresses PBA of the second memory blocks BLKn+1 to BLKz.

The device manager 122 may transmit a command to the nonvolatile memory device 110 based on the physical addresses PBA mapped by the address mapper 121. For example, when the write request is not associated with the security write operation, the device manager 122 may transmit a write command to the nonvolatile memory device 110 along with the physical addresses PBA of at least one memory block of the first memory blocks BLK1 to BLKn.

When the write request is associated with the security write operation, the device manager 122 may transmit the write command to the nonvolatile memory device 110 along with the physical addresses PBA of at least one memory block of the second memory blocks BLKn+1 to BLKz.

The device manager 122 may differently manage the first memory blocks BLK1 to BLKn and the second memory blocks BLKn+1 to BLKz. For example, the device manager 122 may differently control procedures necessary upon updating data written to the first memory blocks BLK1 to BLKn and procedures necessary upon updating data written to the second memory blocks BLKn+1 to BLKz.

Figure 2:
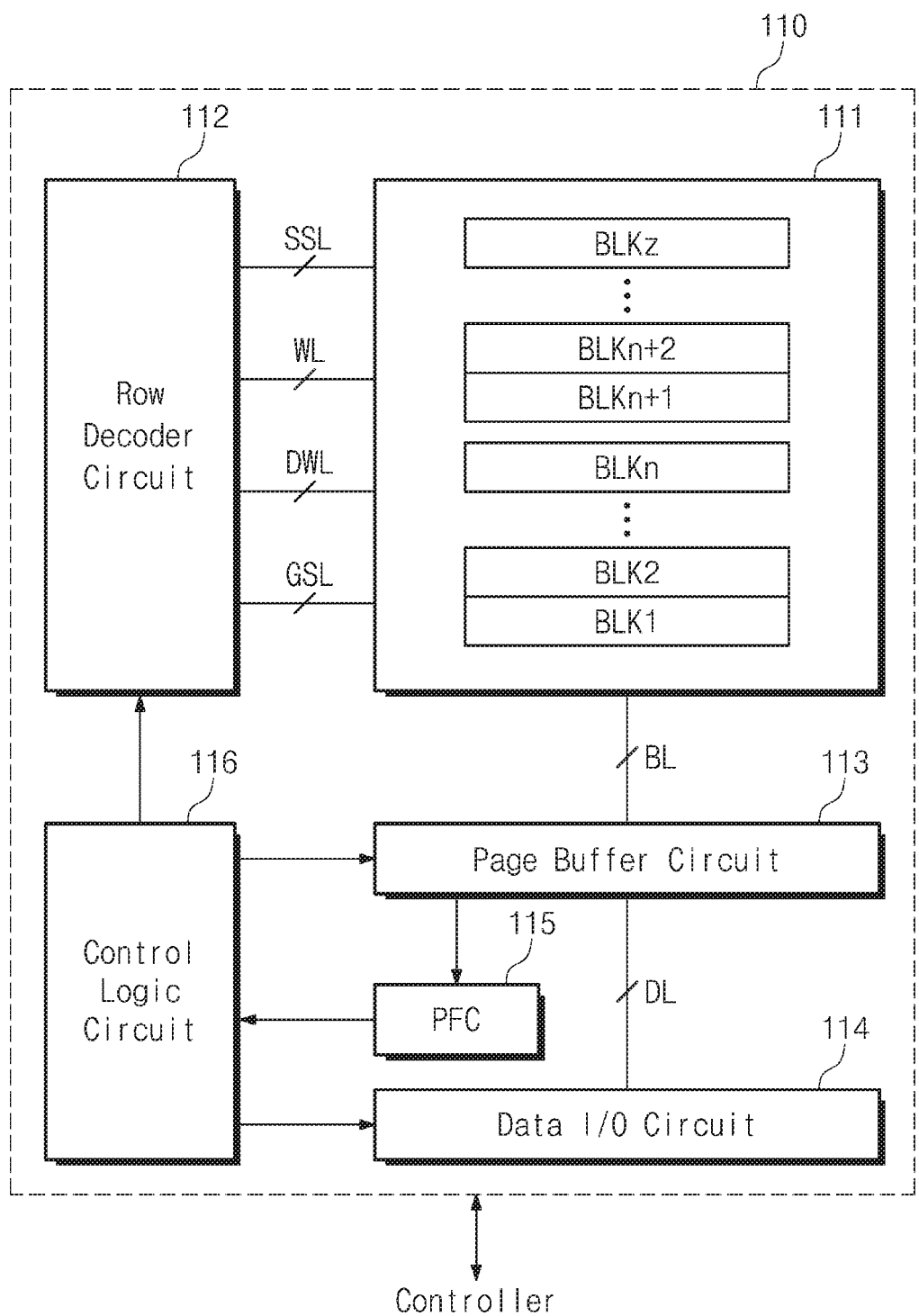
FIG. 2 is a block diagram illustrating a nonvolatile memory device according to an example embodiment of the inventive concepts.

FIG. 2 is a block diagram illustrating the nonvolatile memory device 110 according to an example embodiment of the inventive concepts.

Referring to FIGS. 1 and 2, the nonvolatile memory device 110 includes a memory cell array 111, a row decoder circuit 112, a page buffer circuit 113, a data input/output circuit 114, a pass-fail check circuit 115, and a control logic circuit 116.

The memory cell array 111 includes the plurality of memory blocks BLK1 to BLKz. Each of the memory blocks BLK1 to BLKz includes memory cells. Each of the memory blocks BLK1 to BLKz may be connected to the row decoder circuit 112 through at least one ground selection line GSL, dummy word lines DWL, word lines WL, and at least one string selection line SSL.

Each of the memory blocks BLK1 to BLKz may be connected to the page buffer circuit 113 through a plurality of bit lines BL. The plurality of memory blocks BLK1 to BLKz may be connected in common to the plurality of bit lines BL. The memory cells of the plurality of memory blocks BLK1 to BLKz may have the same structure.

The memory blocks BLK1 to BLKz may be classified into the first memory blocks BLK1 to BLKn and the second memory blocks BLKn+1 to BLKz. The first memory blocks BLK1 to BLKn and the second memory blocks BLKn+1 to BLKz may be classified depending on the purpose of use and may have the same structure.

In an example embodiment, each of the memory blocks BLK1 to BLKz may correspond to a unit of an erase operation. The memory cells of the memory cell array 111 may be erased for each memory block. The memory cells belonging to one memory block may be erased at the same time. For another example, each of the memory blocks BLK1 to BLKz may be divided into sub-blocks. Each of the plurality of sub-blocks may correspond to a unit of the erase operation.

In an example embodiment, each of the plurality of memory blocks BLK1 to BLKz may include a physical storage space which is identified by a block address. Each of the word lines WL may correspond to a physical storage space that is identified by a row address. Each of the plurality of bit lines BL may correspond to a physical storage space that is identified by a column address.

In an example embodiment, each of the memory blocks BLK1 to BLKz may include a plurality of physical pages (e.g., PAGE1 to PAGE8), each of which may include a plurality of memory cells. A physical page may refer to a unit of a program operation. Memory cells of each physical page may be simultaneously programmed. Each physical page may include a plurality of logical pages.

Bits which are programmed in respective memory cells of each physical page may constitute logical pages. First bits which are programmed in memory cells of each physical page may constitute a first logical page. K-th bits (K being a positive integer) which are programmed in the memory cells of each physical page may constitute a k-th logical page.

The row decoder circuit 112 is connected to the memory cell array 111 through a plurality of ground selection lines GSL, the dummy word lines DWL, the word lines WL, and a plurality of string selection lines SSL. The row decoder circuit 112 operates under control of the control logic circuit 116.

The row decoder circuit 112 may decode an address received from the controller 120 through a first channel (e.g., an input/output channel) and may control voltages to be applied to the string selection lines SSL, the dummy word lines DWL, the word lines WL, and the ground selection lines GSL depending on the decoded address.

The page buffer circuit 113 is connected to the memory cell array 111 through the plurality of bit lines BL. The page buffer circuit 113 is connected with the data input/output circuit 114 through a plurality of data lines DL. The page buffer circuit 113 operates under control of the control logic circuit 116.

In the write operation, the page buffer circuit 113 may store data to be written to memory cells. The page buffer circuit 113 may apply voltages to the plurality of bit lines BL based on the stored data. In a verification read operation associated with the read operation, the write operation, or the erase operation, the page buffer circuit 113 may sense voltages of the bit lines BL and may store a result of the sensing operation.

The data input/output circuit 114 is connected with the page buffer circuit 113 through the plurality of data lines DL. The data input/output circuit 114 may output data read by the page buffer circuit 113 to the controller 120 through the input/output channel and may transmit data received from the controller 120 through the input/output channel to the page buffer circuit 113.

After the verification read operation associated with the write operation or the erase operation, the pass-fail check circuit (PFC) 115 may receive the sensing result from the page buffer circuit 113. The pass-fail check circuit 115 may determine a pass or fail of the write or erase operation based on the received sensing result.

For example, in the verification read operation associated with the write operation, the page buffer circuit 113 may count the number of on-cells which are turned on. In the verification read operation associated with the erase operation, the page buffer circuit 113 may count the number of off-cells which are turned off. If the count value (or the number of off-cells) is not smaller than a threshold value, the pass-fail check circuit 115 may determine that the erase operation fails (e.g., erase fail). If the number of off-cells is smaller than the threshold value, the pass-fail check circuit 115 may determine that the erase operation is successful (e.g., erase pass).

The control logic circuit 116 may receive a command through a first channel and a control signal through a second channel (a control channel) from the controller 120. The control logic circuit 116 may receive the command input through the first channel in response to the control signal, may route an address received through the second channel to the row decoder circuit 112, and may route data received through the first channel to the data input/output circuit 114.

The control logic circuit 116 may decode the received command and may control the nonvolatile memory device 110 depending on the decoded command. In the verification read operation associated with the write operation or the erase operation, the control logic circuit 116 may receive the pass or fail determination result from the pass-fail check circuit 115.

Figure 3:
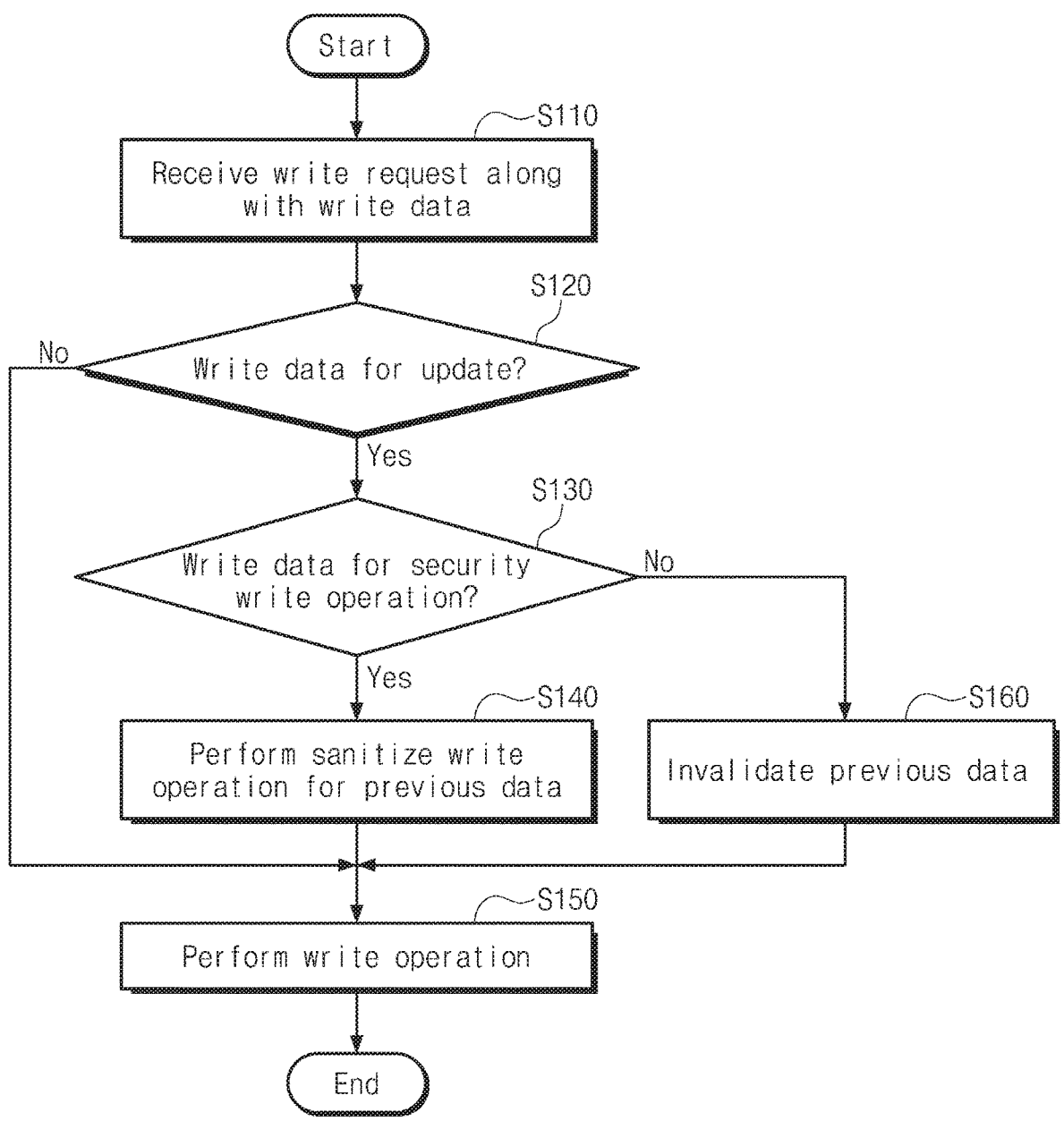
FIG. 3 is a flowchart illustrating an example in which a storage device according to an example embodiment of the inventive concepts updates previous data.

FIG. 3 is a flowchart illustrating an example in which the storage device 100 according to an example embodiment of the inventive concepts updates previous data.

Referring to FIGS. 1 to 3, in operation S110, the controller 120 may receive a write request from the host device 20 along with write data.

In operation S120, the controller 120 may determine whether the received write data are data for updating previous data. For example, the controller 120 may determine whether the write data (e.g., first write data) included in the write request or second write data derived (or generated) from the first write data are data for update.

When the write data are data for update, in operation S130, the controller 120 may determine whether the write data are data for the security write operation. For example, the controller 120 may perform the determination based on information provided from the host device 20 or based on a characteristic of the write data.

For example, the write request may include the first write data, and the controller 120 may generate the second write data from the first write data. The first write data may be update data associated with a normal write operation of the first memory blocks BLK1 to BLKn. The second write data may be update data associated with the security write operation of the second memory blocks BLKn+1 to BLKz.

When the write data are the update data associated with the security write operation, operation S140 is performed. In operation S140, the storage device 100 may perform a sanitize write operation on the previous data. The controller 120 may transmit a sanitize write command to the nonvolatile memory device 110 along with physical addresses PBA of the previous data.

Afterwards, in operation S150, the controller 120 may perform the write operation on the write data (e.g., update data). The controller 120 may transmit the write command to the nonvolatile memory device 110 along with physical addresses PBA of the write data.

That is, upon updating the previous data through the security write operation associated with the second memory blocks BLKn+1 to BLKz, the controller 120 may sequentially transmit the sanitize write command and the write command to the nonvolatile memory device 110. The nonvolatile memory device 110 may sequentially perform the sanitize write operation and the write operation. The security write operation may include the sanitize write operation and the write operation.

For example, the controller 120 may transmit the write command after transmitting the sanitize write command or may transmit the sanitize write command after transmitting the write command. The nonvolatile memory device 110 may perform the write operation after performing the sanitize write operation or may perform the sanitize write operation after performing the write operation.

In an example embodiment, the sanitize write command for the sanitize write operation may have the same format as the write command for the write operation. For another example, the format of the sanitize write command for the sanitize write operation may be different from the format of the write command for the write operation.

For example, the controller 120 may transmit dummy data for the sanitize write operation to the nonvolatile memory device 110. For another example, the nonvolatile memory device 110 may internally generate the dummy data for the sanitize write operation. When the sanitize write operation is performed, previous data written to the second memory blocks BLKn+1 to BLKz may be sanitized such that the previous data are difficult (or, alternatively, impossible) to read.

As the term "write" of the sanitize write operation gives a hint, unlike the erase operation, the sanitize write operation may sanitize the previous data in the form that makes the data difficult (or, alternatively, impossible) to read, by increasing threshold voltages of memory cells. The sanitize write operation may be selectively performed in unit of page.

The previous data may be sanitized by performing the sanitize write operation only on pages, in which the previous data are written, without performing the erase operation on a second memory block, in which the previous data are written, from among the second memory blocks BLKn+1 to BLKz. Accordingly, upon updating data having a higher security level than any other data, the previous data are sanitized in the form difficult (or, alternatively, impossible) to read, without the erase operation.

Since there is no need for the erase operation upon updating data written to the second memory blocks BLKn+1 to BLKz, the number of erase operations to be performed in the nonvolatile memory device 110 is decreased. As the number of erase operations is decreased, the stress to be applied to the second memory blocks BLKn+1 to BLKz decreases, and thus, the lifespan of the nonvolatile memory device 110 and the storage device 100 increases.

Returning to operation S130, when the write data are not data for the security write operation, operation S160 is performed. In operation S160, the controller 120 may invalidate the previous data. For example, the controller 120 may invalidate the previous data without transmitting any command to the nonvolatile memory device 110.

The controller 120 may release mapping between logical addresses LBA and physical addresses PBA of the previous data or may add an invalid flag or mark indicating invalid data to mapping information. Afterwards, the storage device 100 may perform the write operation in operation S150.

That is, when updating data written to the first memory blocks BLK1 to BLKn through not the security write operation but the normal write operation, the controller 120 may invalidate the previous data and may transmit the write command to the nonvolatile memory device 110. The nonvolatile memory device 110 may perform the write operation. For example, the controller 120 may perform invalidation after transmitting the write command or may transmit the write command after performing invalidation.

Returning to operation S120, when the write data are not data for update, operation S150 is performed. In operation S150, the storage device 100 may perform the write operation. The controller 120 may transmit the write command to the nonvolatile memory device 110. The nonvolatile memory device 110 may perform the write operation.

For example, the controller 120 may transmit the write command for the first memory blocks BLK1 to BLKn to the nonvolatile memory device 110 along with the first write data. The controller 120 may transmit the write command for the second memory blocks BLKn+1 to BLKz to the nonvolatile memory device 110 along with the second write data.

Figure 4:
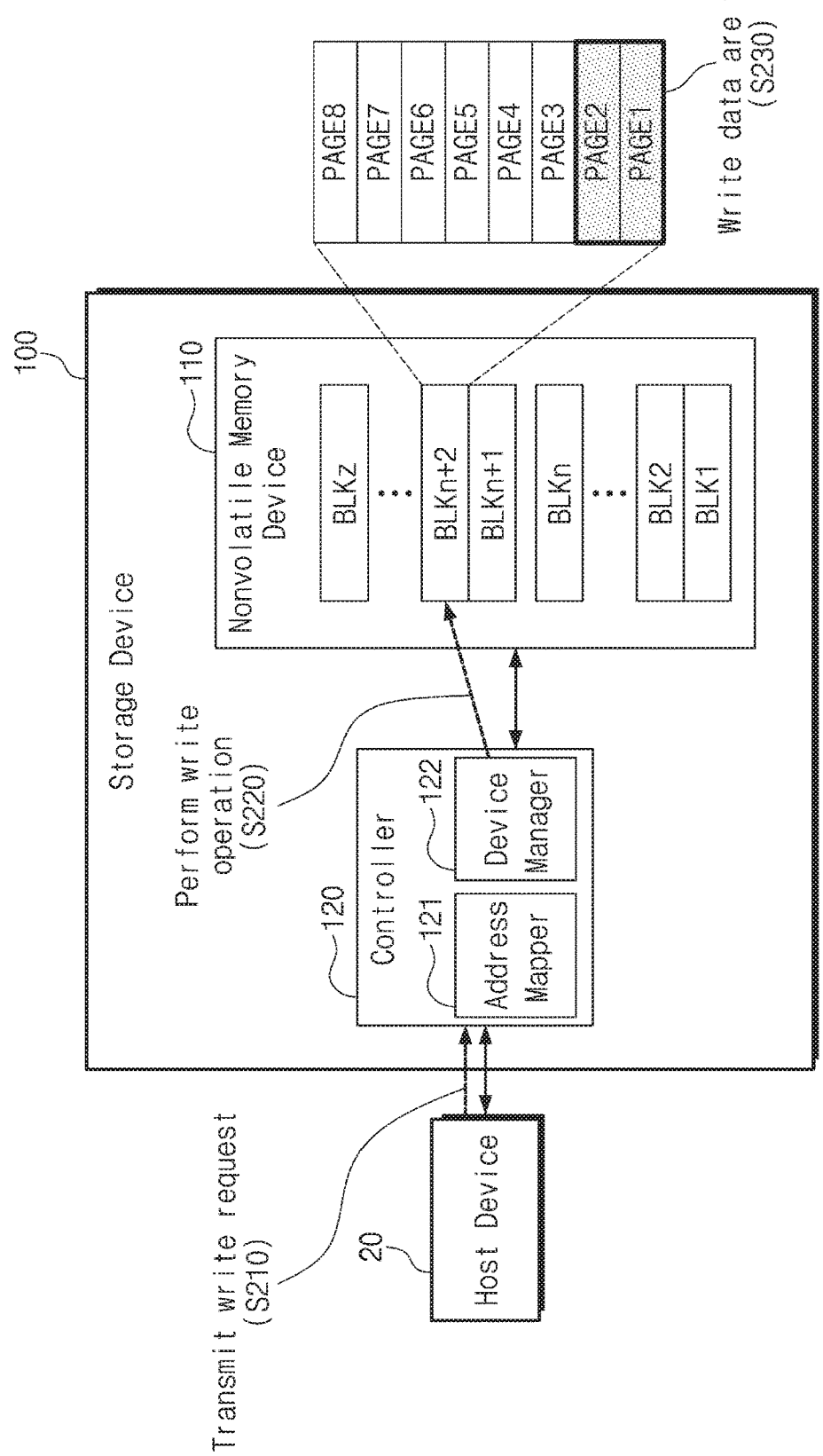
FIG. 4 is a diagram illustrating an example of a security write operation in which a storage device writes data to second memory blocks.

FIG. 4 is a diagram illustrating an example of a security write operation in which the storage device 100 writes data to the second memory blocks BLKn+1 to BLKz.

Referring to FIG. 4, in operation S210, the host device 20 may transmit the write request to the controller 120. The write request may include the first write data.

In response to the write request, the controller 120 may determine whether the write request causes the security write operation associated with the second memory blocks BLKn+1 to BLKz. For example, depending on information provided from the host device 20 or from a characteristic of the first write data, the controller 120 may determine whether the first write data need the security write operation.

For another example, the controller 120 may generate the second write data, which are used to manage the first write data, from the first write data. The controller 120 may write the first write data to the first memory blocks BLK1 to BLKn through the normal write operation, and may write the second write data to the second memory blocks BLKn+1 to BLKz through the security write operation.

When the write request causes the security write operation, in operation S220, the controller 120 may perform the write operation on the second memory blocks BLKn+1 to BLKz. For example, the controller 120 may transmit physical addresses PBA, which indicate one memory block of the second memory blocks BLKn+1 to BLKz, and the write command to the nonvolatile memory device 110 along with the first write data or the second write data.

Depending on the write command, the nonvolatile memory device 110 may perform the write operation on the second memory blocks BLKn+1 to BLKz. As the write operation is performed, in operation S230, the write data are written. For example, the write data may be written to the first page PAGE1 and the second page PAGE2 of the (n+2)-th memory block BLKn+2.

Figure 5:
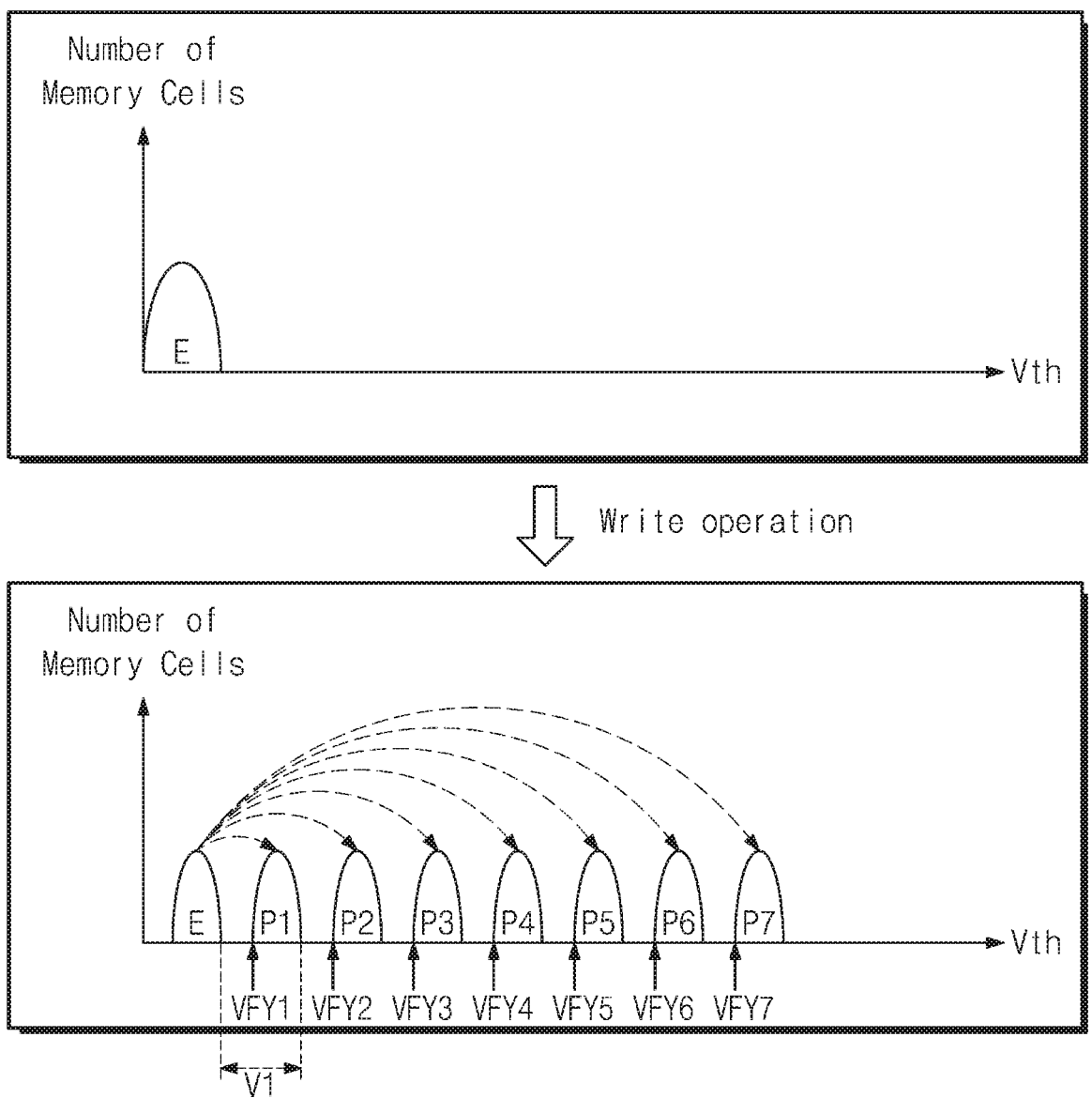
FIG. 5 is a diagram illustrating an example in which threshold voltages of memory cells change when a write operation is performed.

FIG. 5 is a diagram illustrating an example in which threshold voltages of memory cells change when a write operation is performed.

Referring to FIG. 5, in an example embodiment, an example in which threshold voltages of memory cells in the first page PAGE1 and the second page PAGE2 of the (n+2)-th memory block BLKn+2 change is illustrated in FIG. 5. In FIG. 5, a horizontal axis represents threshold voltages Vth of memory cells, and a vertical axis represents the number of memory cells.

Before the write operation is performed, threshold voltages of memory cells may belong to a threshold voltage range corresponding to an erase state "E". In the case where the write operation is performed, the threshold voltages of the memory cells may be maintained or increase to threshold voltage ranges corresponding to the first to seventh program states P1 to P7 depending on write data.

The write operation may be performed by using first to seventh verification voltages VFY1 to VFY7. A threshold voltage of a memory cell to which data corresponding to a k-th program state Pk (k being an integer ranging from "1" to "7") will be written may be controlled to be higher than a k-th verification voltage VERk.

Figure 6:
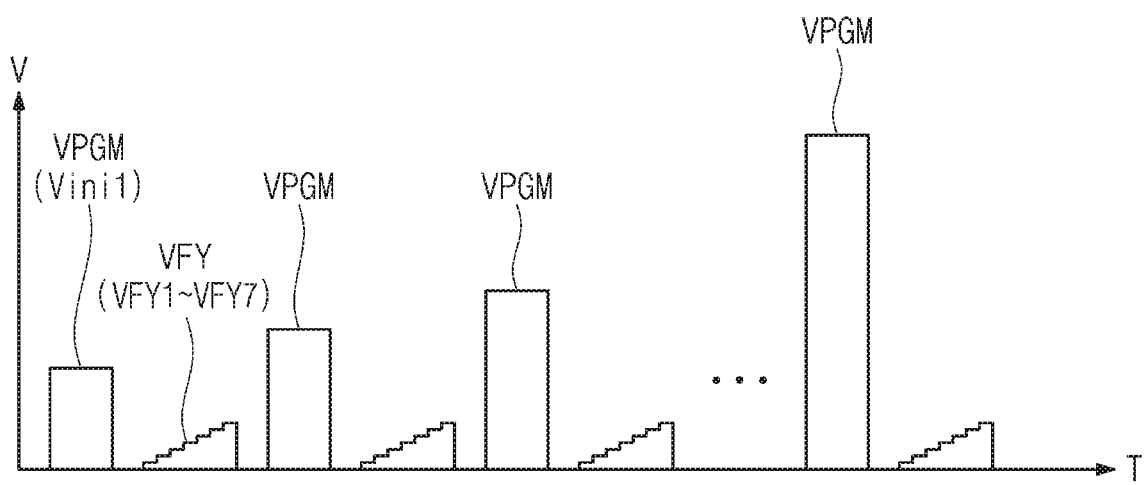
FIG. 6 is a diagram illustrating an example of voltages to be applied to memory cells in a write operation.

FIG. 6 is a diagram illustrating an example of voltages to be applied to memory cells in a write operation. In an example embodiment, an example of voltages to be applied to memory cells through word lines is illustrated in FIG. 6.

Referring to FIGS. 2 and 4 to 6, the write operation may include program loops. Each program loop may include applying a program voltage VPGM to memory cells and then applying verification voltages VFY.

A program voltage VPGM which is applied to the memory cells in a first program loop may be a first initial program voltage Vini1. The verification voltages VFY may include the first to seventh verification voltages VFY1 to VFY7 corresponding to the program states P1 to P7.

The threshold voltages of the memory cells increase when the program voltage VPGM is applied in each program loop. The nonvolatile memory device 110 may perform verification read operations by using the verification voltages VFY. Depending on results of the verification read operations, the pass-fail check circuit 115 may determine whether the threshold voltages of the memory cells belong to a target range.

For the purpose of preventing the threshold voltages of the memory cells from exceeding the target range, that is, from being over-programmed, the first initial program voltage Vini1 may be determined in consideration of a first voltage V1. For example, when the first initial program voltage Vini1 is applied to a memory cell having the highest threshold voltage in a threshold voltage range of the erase state "E", the first initial program voltage Vini1 may be set such that the threshold voltage of the memory cell does not exceed the threshold voltage range of the first program state P1.

Afterwards, as the program loops are repeated, the program voltage VPGM may gradually increase. As the program voltage VPGM gradually increases, the memory cells may have threshold voltages belonging to a target threshold voltage range without being over-programmed.

An example in which three bits are written to one memory cell of the (n+2)-th memory block BLKn+2 is described with reference to FIGS. 5 and 6. However, the number of bits to be written to one memory cell of the (n+2)-th memory block BLKn+2 is not limited. For example, security data needing the security write operation may need higher reliability than any other data.

Accordingly, in the security write operation, one or two security data bits may be written to one memory cell in the (n+2)-th memory block BLKn+2. Also, in the case where the reliability of the storage device 100 is improved, four or more security data bits may be written to one memory cell in the (n+2)-th memory block BLKn+2.

With regard to the description given with reference to FIG. 5, the number of threshold voltage ranges of memory cells after the security write operation is performed may be "2^X" ("X" being the number of bits to be written), With regard to the description given with reference to FIG. 6, the number of verification voltages when the security write operation is performed may be "2^X−1" ("X" being the number of bits to be written).

Figure 7:
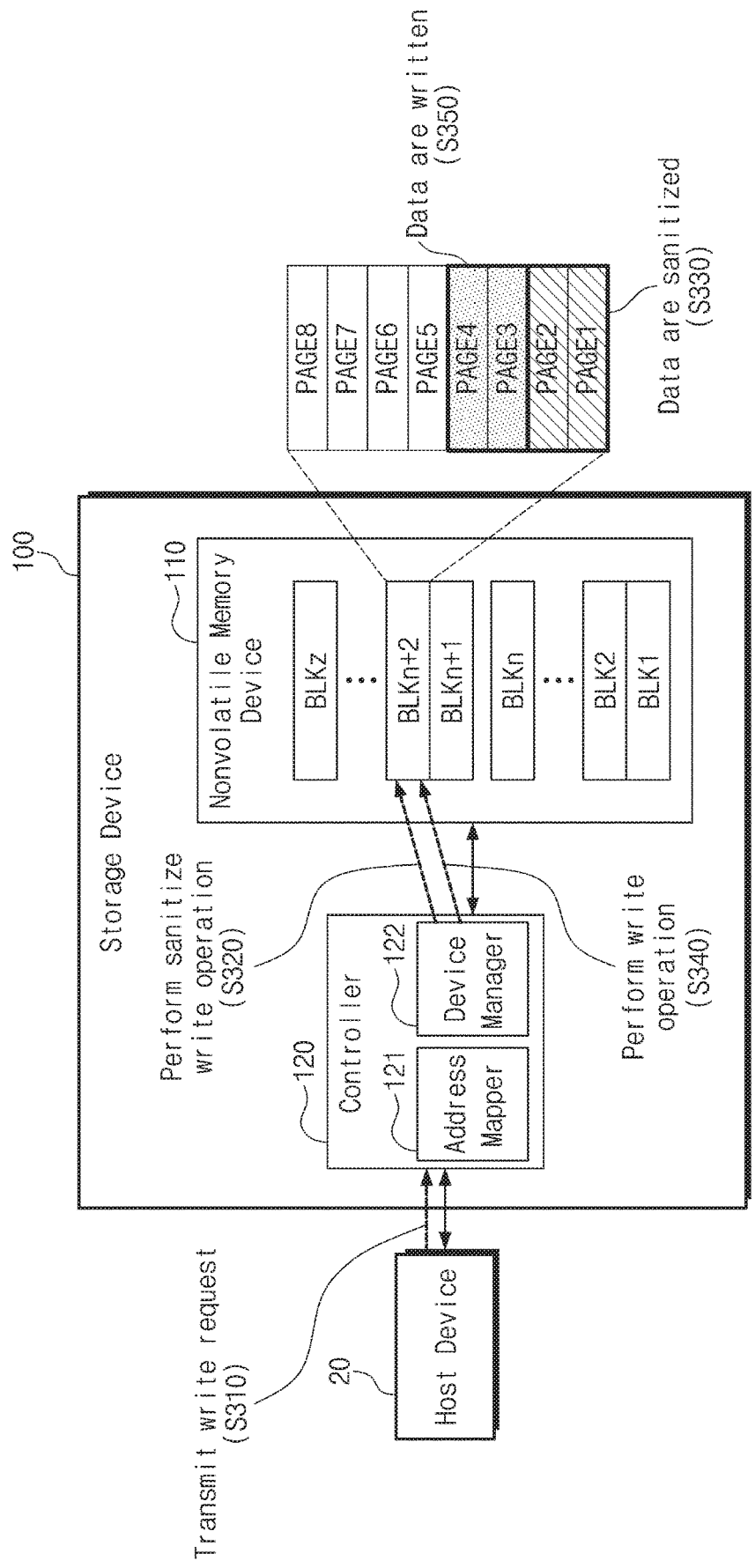
FIG. 7 is a diagram illustrating an example in which a storage device updates previous data written to second memory blocks depending on a request of the host device.

FIG. 7 is a diagram illustrating an example in which the storage device 100 updates previous data written to the second memory blocks BLKn+1 to BLKz depending on a request of the host device 20.

Referring to FIG. 7, in operation S310, the host device 20 may transmit write request for the security write operation to the controller 120. A write request may include third write data.

In response to the write request, the controller 120 may determine whether the write request causes the security write operation associated with the second memory blocks BLKn+1 to BLKz. For example, the controller 120 may determine whether the third write data or fourth write data generated from the third write data need the security write operation associated with the second memory blocks BLKn+1 to BLKz.

When the security write operation is caused according to the write request, the controller 120 may determine whether the third write data or the fourth write data cause updating of data previously written to the second memory blocks BLKn+1 to BLKz. For example, in the case where the third write data or the fourth write data are data for updating data written to the first and second pages PAGE1 and PAGE2 of the (n+2)-th memory block BLKn+2, in operation S320, the controller 120 may perform the sanitize write operation on previous data written to the first page PAGE1 and the second page PAGE2 of the (n+2)-th memory block BLKn+2.

The controller 120 may transmit the sanitize write command and physical addresses PBA of the previous data to the nonvolatile memory device 110. The sanitize write command may have the same format as the write command, or the format of the sanitize write command may be different from the format of the write command. In response to the sanitize write command, the nonvolatile memory device 110 may perform the sanitize write operation on the first page PAGE1 and the second page PAGE2 of the (n+2)-th memory block BLKn+2 to which the previous data are written.

The sanitize write operation may include sanitizing previous data by increasing threshold voltages of memory cells to which the previous data are written. When the sanitize write operation is performed, in operation S330, the previous data may be sanitized in the form difficult (or, alternatively, impossible) to read. The controller 120 may identify the physical addresses PBA of the first page PAGE1 and the second page PAGE2 as addresses where invalid data are stored.

After the sanitize write operation is completed, in operation S340, the controller 120 may perform the write operation on the (n+2)-th memory block BLKn+2. The controller 120 may transmit physical addresses PBA of the (n+2)-th memory block BLKn+2 and the write command to the nonvolatile memory device 110 along with the third write data or the fourth write data.

The nonvolatile memory device 110 may perform the write operation in response to the write command. As the write operation is performed, in operation S350, the third write data or the fourth write data may be written to the third page PAGE3 and the fourth page PAGE4 of the (n+2)-th memory block BLKn+2.

In an example embodiment, when data stored in the second memory blocks BLKn+1 to BLKz are updated, update data may be written to the same memory block as the previous data. In the case where a storage capacity of the same memory block is insufficient, the write operation may be performed on a free memory block.

For example, in the case where the storage capacity of the (n+2)-th memory block BLKn+2 is insufficient, the write operation may be performed on any other memory block (e.g., BLKz) after the sanitize write operation is performed on the previous data of the (n+2)-th memory block BLKn+2. The erase operation associated with the (n+2)-th memory block BLKn+2, the storage capacity of which is insufficient, may be reserved. The controller 120 may transmit the erase command to the (n+2)-th memory block BLKn+2 depending on an internal schedule. The nonvolatile memory device 110 may perform the erase operation on the (n+2)-th memory block BLKn+2 depending on the erase command.

Figure 8:
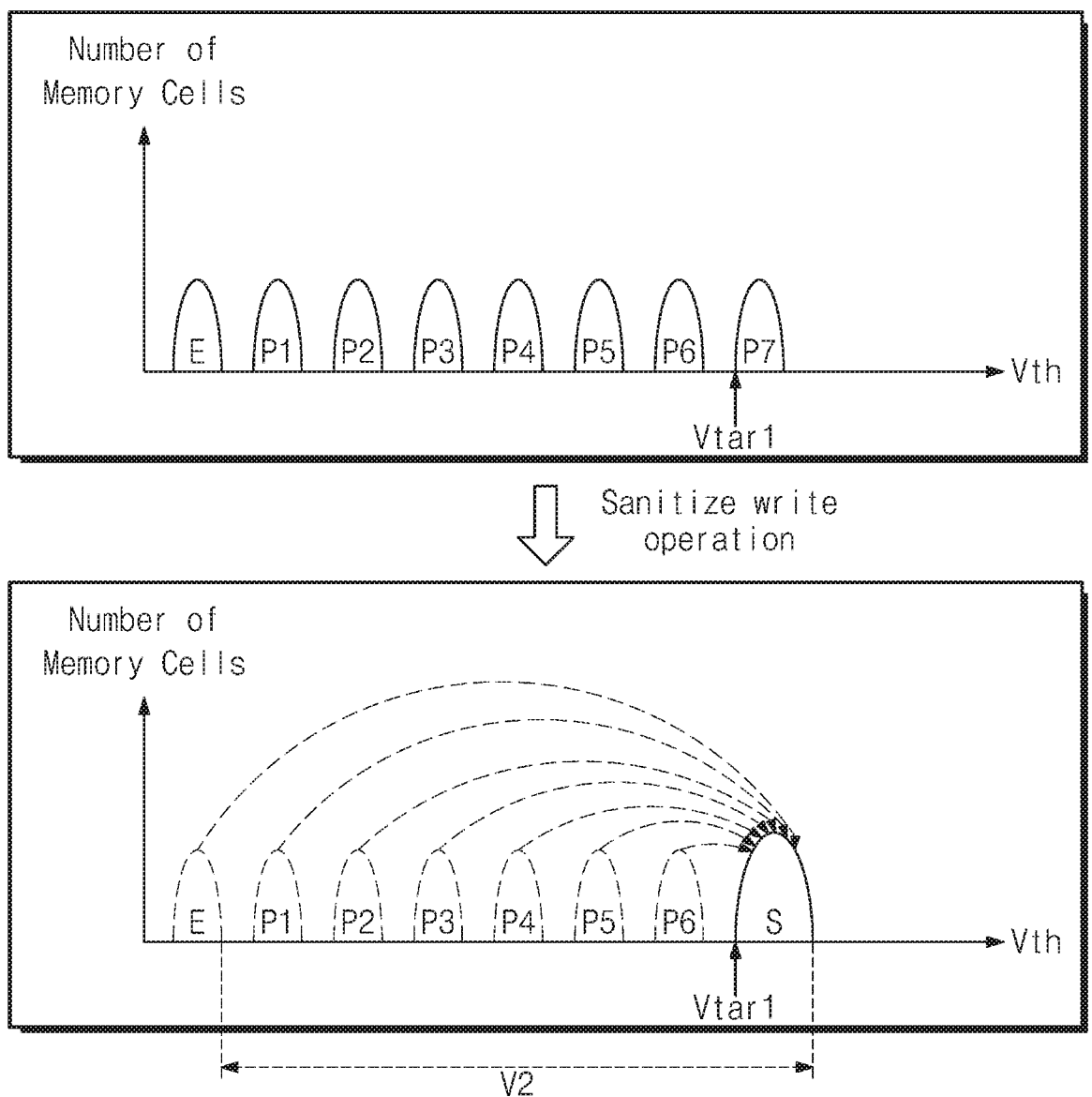
FIG. 8 is a diagram illustrating an example in which threshold voltages of memory cells change when a sanitize write operation is performed.

FIG. 8 is a diagram illustrating an example in which threshold voltages of memory cells change when a sanitize write operation is performed.

Referring to FIG. 8, in an example embodiment, an example in which threshold voltages of memory cells in the first page PAGE1 and the second page PAGE2 of the (n+2)-th memory block BLKn+2 change is illustrated in FIG. 8. In FIG. 8, a horizontal axis represents threshold voltages Vth of memory cells, and a vertical axis represents the number of memory cells.

As described with reference to FIG. 5, before the sanitize write operation is performed, the threshold voltages of the memory cells belong to threshold voltage ranges corresponding to the erase state "E" and the first to seventh program states P1 to P7. In the case where the sanitize write operation is performed, the threshold voltages of the memory cells may increase to a threshold voltage range of a sanitize state "S".

The sanitize write operation may be performed by using a first target voltage Vtar1. The sanitize write operation may allow the threshold voltages of the memory cells to be higher than the first target voltage Vtar1. For example, the first target voltage Vtar1 may be determined depending on the seventh program state P7 having the highest threshold voltage range. The first target voltage Vtar1 may be set to be the same as the seventh verification voltage VFY7 of the seventh program state P7.

In the case where the threshold voltages of the memory cells are controlled to be higher than the first target voltage Vtar1, previous data may not be read from the memory cells. This means that the previous data are sanitized. Accordingly, the level of security may be improved.

The sanitize write operation is performed in the same manner as the write operation. That is, the sanitize write operation may be performed in unit of page. The sanitize write operation may be performed on the first and second pages PAGE1 and PAGE2, in which the previous data are stored, of the (n+2)-th memory block BLKn+2 where the previous data are stored. Even though the sanitize write operation is performed, the remaining pages of the (n+2)-th memory block BLKn+2 are usable. Accordingly, update data may be written to the (n+2)-th memory block BLKn+2 without erasing the (n+2)-th memory block BLKn+2.

Figure 9:
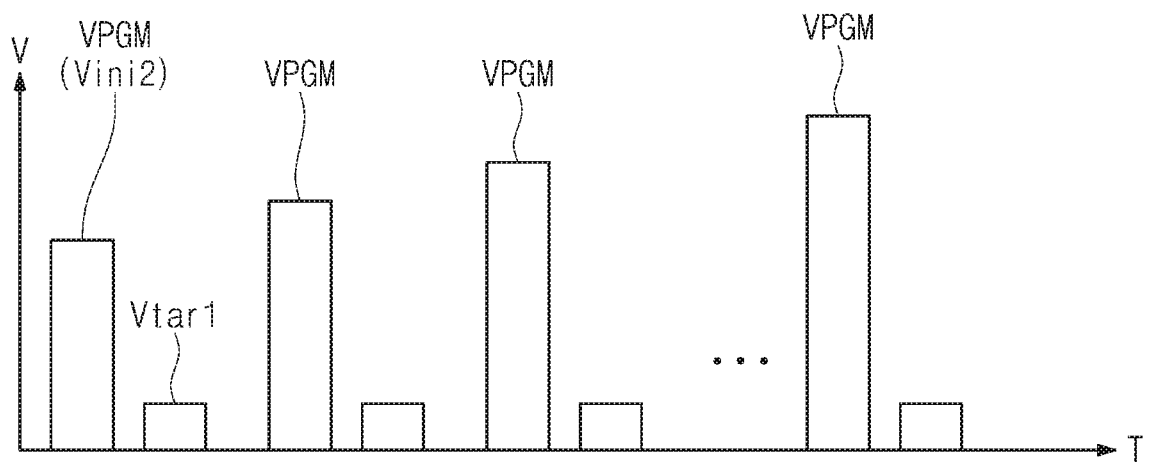
FIG. 9 is a diagram illustrating an example of voltages to be applied to memory cells in a sanitize write operation.

FIG. 9 is a diagram illustrating an example of voltages to be applied to memory cells in a sanitize write operation. In an example embodiment, an example of voltages to be applied to memory cells through word lines is illustrated in FIG. 9.

Referring to FIGS. 2 and 7 to 9, the sanitize write operation may include program loops. Each program loop may include applying the program voltage VPGM to memory cells and then applying the first target voltage Vtar1.

The program voltage VPGM which is applied to the memory cells in a first program loop may be a second initial program voltage Vini2. Threshold voltages of the memory cells increase when the program voltage VPGM is applied in each program loop. The nonvolatile memory device 110 may perform the verification read operation by using the first target voltage Vtar1. Depending on a result of the verification read operation, the pass-fail check circuit 115 may determine whether the threshold voltages of the memory cells are higher than the first target voltage Vtar1.

For the purpose of preventing the threshold voltages of the memory cells from exceeding the target range, that is, from being over-programmed, the second initial program voltage Vini2 may be determined in consideration of a second voltage V2. For example, when the second initial program voltage Vini2 is applied to a memory cell having the highest threshold voltage in a threshold voltage range of the erase state "E", the second initial program voltage Vini2 may be set such that the threshold voltage of the memory cell does not exceed a threshold voltage range of the sanitize state "S".

In an example embodiment, the second voltage V2 may be higher than the first voltage V1 described with reference to FIG. 5. Accordingly, the second initial program voltage Vini2 of the sanitize write operation may be higher than the first initial program voltage Vini1 of the write operation described with reference to FIG. 6. In an example embodiment, the number of program loops of the sanitize write operation may be smaller than the number of program loops of the write operation.

Figure 10:
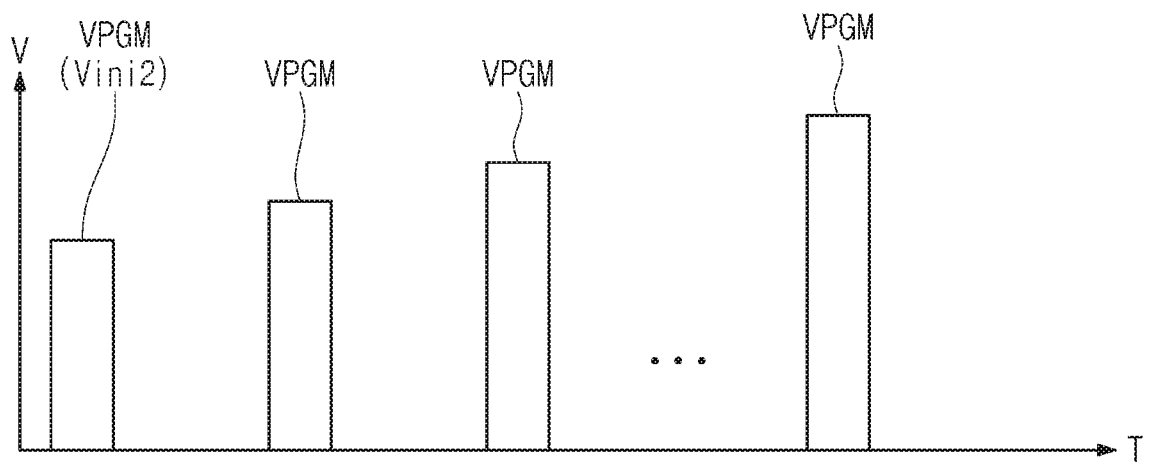
FIG. 10 is a diagram illustrating another example of voltages to be applied to memory cells in a sanitize write operation.

FIG. 10 is a diagram illustrating another example of voltages to be applied to memory cells in a sanitize write operation. In an example embodiment, an example of voltages to be applied to memory cells through word lines is illustrated in FIG. 10.

Referring to FIGS. 2, 7, 8, and 10, the sanitize write operation may include program loops. Each program loop may include applying the program voltage VPGM to memory cells.

The sanitize write operation intends to sanitize previous data in the form difficult (or, alternatively, impossible) to identify. Accordingly, the previous data may be sanitized by applying the program voltage VPGM as much as a preset count, instead of setting the threshold voltages of the memory cells to the sanitize state "S" by using the first target voltage Vtar1. In an example embodiment, the program voltage VPGM may gradually increase. For another example, the program voltage VPGM having the same level may be repeatedly applied to the memory cells.

Figure 11:
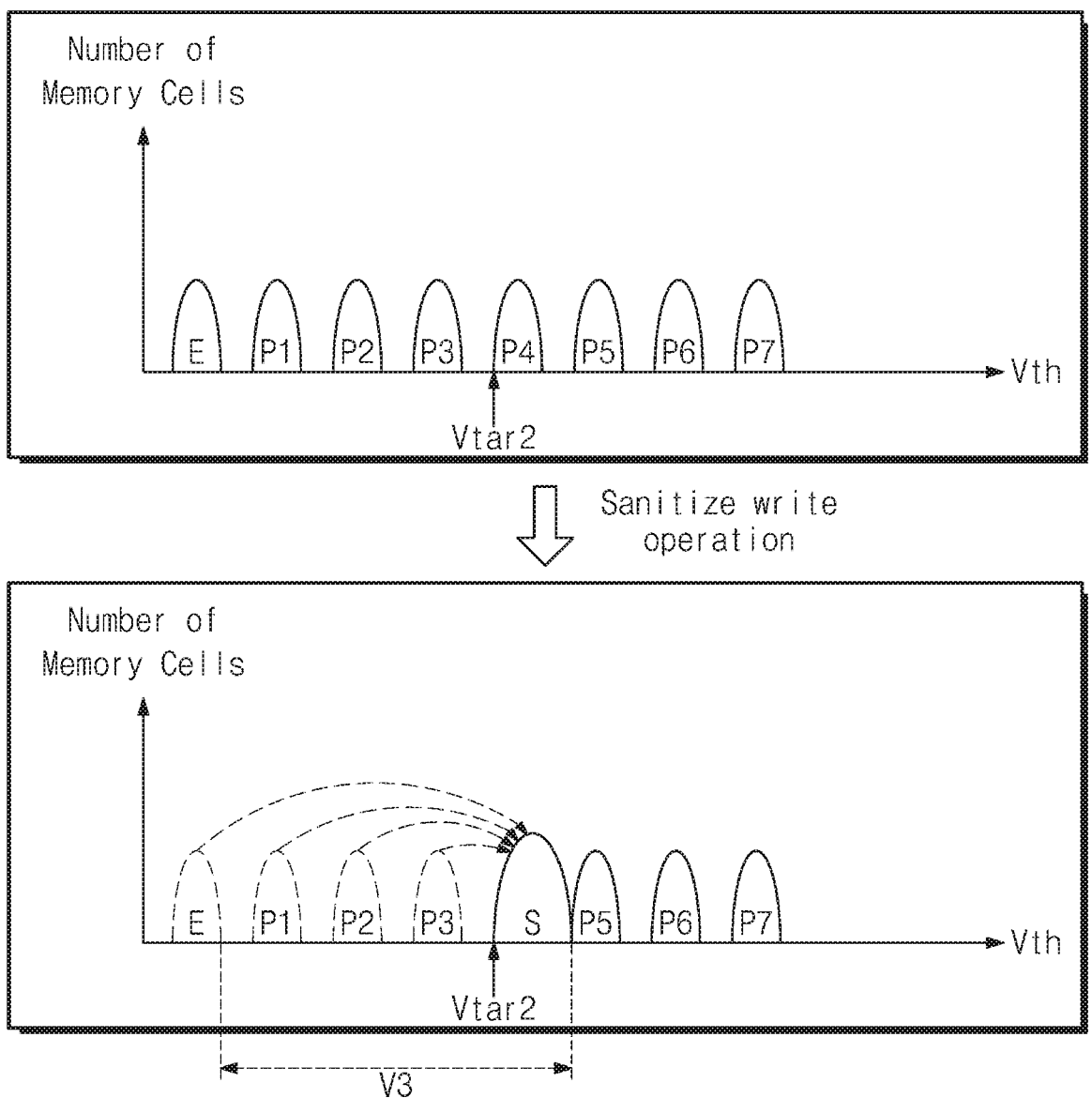
FIG. 11 is a diagram illustrating another example in which threshold voltages of memory cells change when a sanitize write operation is performed.

FIG. 11 is a diagram illustrating another example in which threshold voltages of memory cells change when a sanitize write operation is performed.

Referring to FIG. 11, In an example embodiment, an example in which threshold voltages of memory cells in the first page PAGE1 and the second page PAGE2 of the (n+2)-th memory block BLKn+2 change is illustrated in FIG. 11. In FIG. 11, a horizontal axis represents threshold voltages Vth of memory cells, and a vertical axis represents the number of memory cells.

Compared to FIG. 8, the sanitize write operation may be performed by using a second target voltage Vtar2. The second target voltage Vtar2 may be lower than the first target voltage Vtar1. For example, the second target voltage Vtar2 may be lower than at least one of the first to seventh verification voltages VFY1 to VFY7 used in the verification read operation.

Memory cells which have threshold voltages lower than the second target voltage Vtar2 may be controlled to belong to the threshold voltage range of the sanitize state "S" including threshold voltages higher than the second target voltage Vtar2. For example, threshold voltages of memory cells belonging to at least one threshold voltage range of threshold voltage ranges corresponding to the states "E" and P1 to P7, which the memory cells have, may increase to the sanitize state "S".

For example, in addition to the voltage applying method described with reference to FIG. 9 or 10, a verification read operation for detecting memory cells having threshold voltages lower than the second target voltage Vtar2 may be performed before the sanitize write operation.

For the purpose of preventing the threshold voltages of the memory cells from exceeding the target range, that is, from being over-programmed, an initial program voltage may be determined in consideration of a third voltage V3. The initial program voltage of the sanitize write operation described with reference to FIG. 11 may be higher than an initial program voltage of a program operation.

Figure 12:
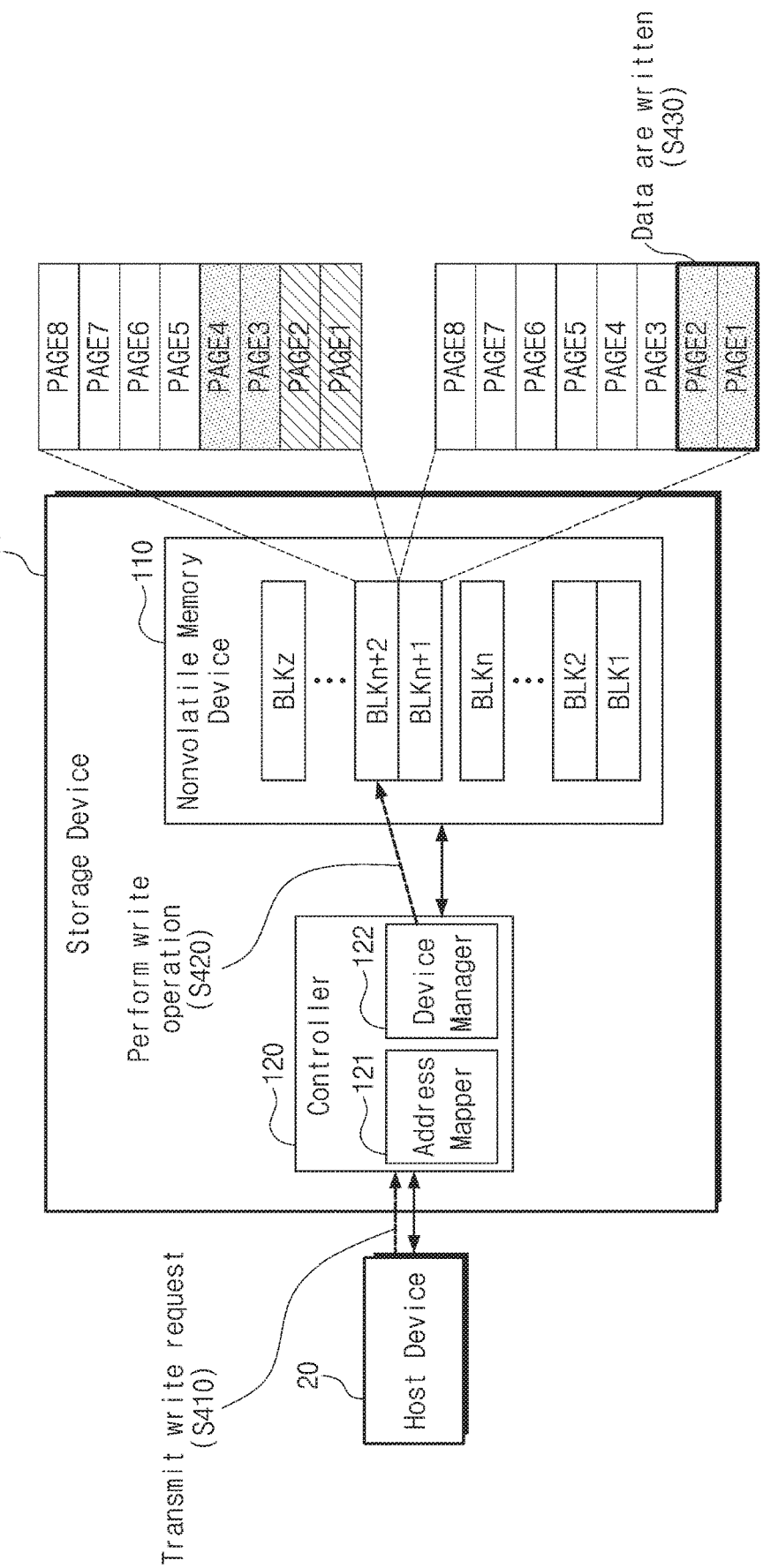
FIG. 12 is a diagram illustrating an example in which a storage device writes new data to second memory blocks depending on a request of the host device.

FIG. 12 is a diagram illustrating an example in which the storage device 100 writes new data to the second memory blocks BLKn+1 to BLKz depending on a request of the host device 20.

Referring to FIG. 12, in operation S410, the host device 20 may transmit a write request to the controller 120. The write request may include fifth write data.

For example, the fifth write data or sixth write data generated from the fifth write data may be determined as new data to be written to the second memory blocks BLKn+1 to BLKz. In operation S420, the controller 120 may perform the write operation on the (n+1)-th memory block BLKn+1. The controller 120 may transmit physical addresses PBA of the (n+1)-th memory block BLKn+1 and the write command to the nonvolatile memory device 110 along with the fifth write data or the sixth write data.

The nonvolatile memory device 110 may perform the write operation in response to the write command. As the write operation is performed, in operation S430, write data may be written to the first page PAGE1 and the second page PAGE2 of the (n+1)-th memory block BLKn+1. In an example embodiment, the controller 120 may maintain one kind of data in each of the second memory blocks BLKn+1 to BLKz.

Figure 13:
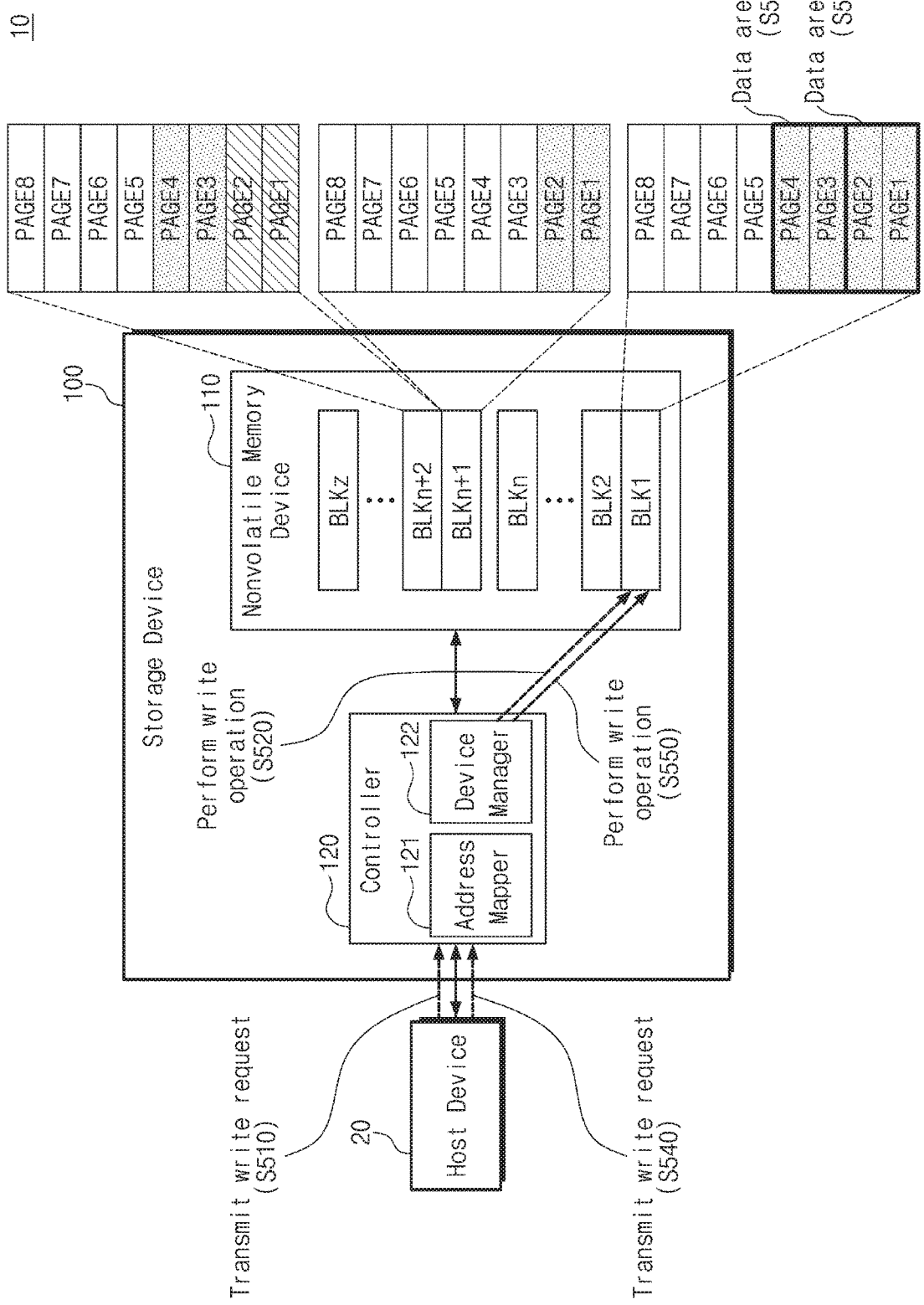
FIG. 13 is a diagram illustrating an example in which a storage device writes data to first memory blocks depending on a request of a host device.

FIG. 13 is a diagram illustrating an example in which the storage device 100 writes data to the first memory blocks BLK1 to BLKn depending on a request of the host device 20.

Referring to FIG. 13, in operation S510, the host device 20 may transmit a first write request to the controller 120. The first write request may include seventh write data.

When the first write request causes the normal write operation, in operation S520, for example, the controller 120 may perform the write operation on the first memory block BLK1. The controller 120 may transmit physical addresses PBA of the first memory block BLK1 and the write command to the nonvolatile memory device 110 along with the seventh write data. In response to the write command, in operation S530, write data may be written to the first page PAGE1 and the second page PAGE2 of the first memory block BLK1.

In operation S540, the host device 20 may transmit a second write request to the controller 120. The second write request may include eighth write data. When the second write request causes the normal write operation, in operation S550, for example, the controller 120 may perform the write operation on the first memory block BLK1.

The controller 120 may transmit physical addresses PBA of the first memory block BLK1 and the write command to the nonvolatile memory device 110 along with the eighth write data. In operation S560, write data may be written to the third page PAGE3 and the fourth page PAGE4 of the first memory block BLK1.

In an example embodiment, the eighth write data may be data for updating the seventh write data. In this case, the controller 120 may not transmit the sanitize write command to the nonvolatile memory device 110. The controller 120 may store a flag or mark providing notification that invalid data are stored in the first page PAGE1 and the second page PAGE2 of the first memory block BLK1.

That is, the controller 120 may invalidate previous data upon updating data stored in the first memory block BLK1. The controller 120 may sanitize previous data through the sanitize write command upon updating data stored in the second memory blocks BLKn+1 to BLKz. The controller 120 may differently manage update operations of the first memory blocks BLK1 to BLKn and the second memory blocks BLKn+1 to BLKz.

Figure 14:
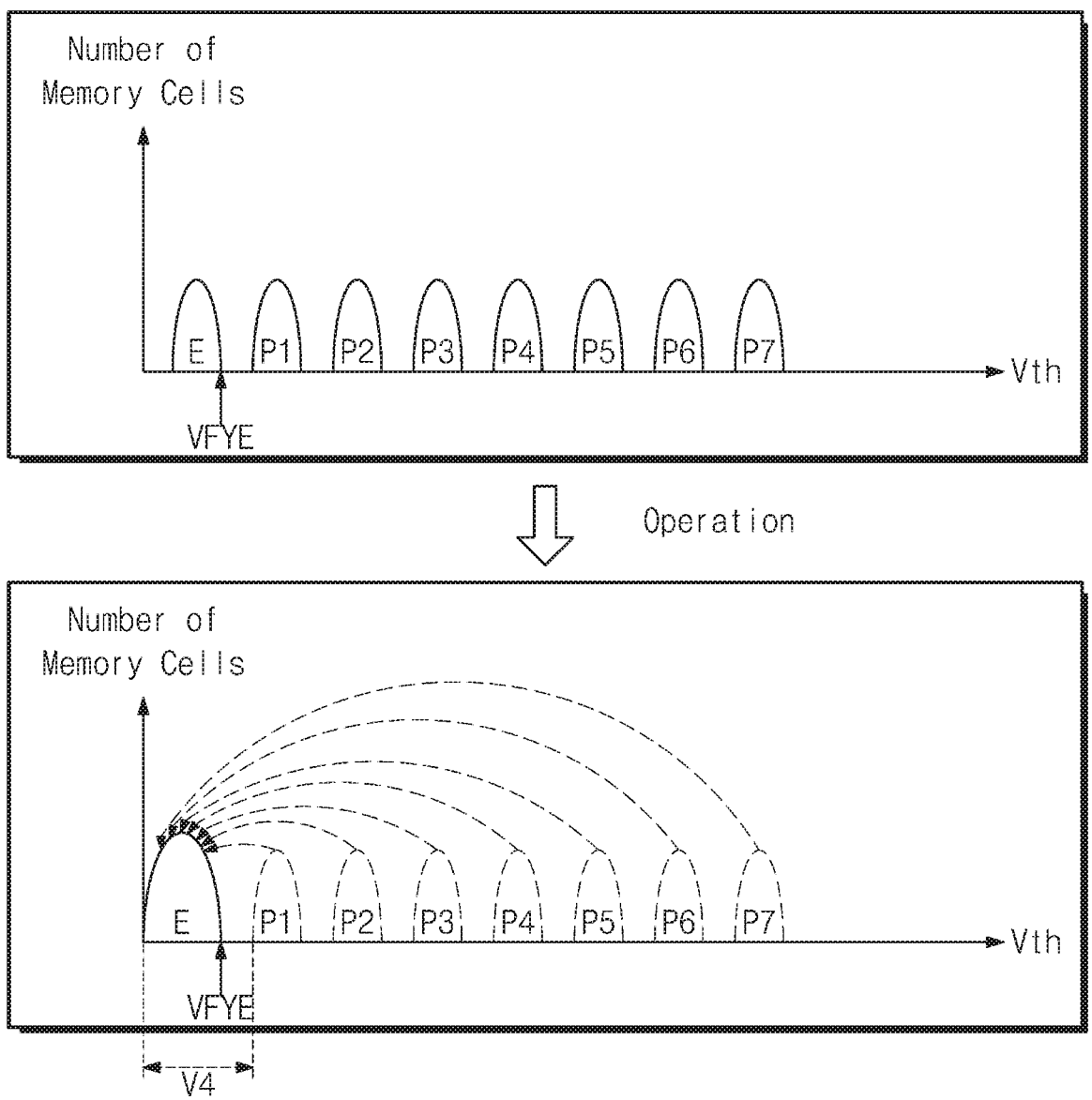
FIG. 14 is a diagram illustrating an example in which threshold voltages of memory cells change when an erase operation is performed in first memory blocks.

FIG. 14 is a diagram illustrating an example in which threshold voltages of memory cells change when an erase operation is performed in the first memory blocks BLK1 to BLKn.

Referring to FIG. 14, in FIG. 14, a horizontal axis represents threshold voltages Vth of memory cells, and a vertical axis represents the number of memory cells. For example, when all data stored in one memory block of the first memory blocks BLK1 to BLKn are invalid data, the memory block may be erased.

As described with reference to FIG. 5, threshold voltages of the memory cells of a memory block targeted for the erase operation among the first memory blocks BLK1 to BLKn may belong to threshold voltage ranges corresponding to the erase state "E" and the first to seventh program states P1 to P7. In the case where the erase operation is performed, the threshold voltages of the memory cells may belong to a threshold voltage range corresponding to the erase state "E".

The erase operation may be performed by using an erase verification voltage VFYE. The erase operation may allow the threshold voltages of the memory cells to be lower than the erase verification voltage VFYE. When the threshold voltages of the memory cells are controlled to be lower than the erase verification voltage VFYE, the erase operation may be completed.

Figure 15:
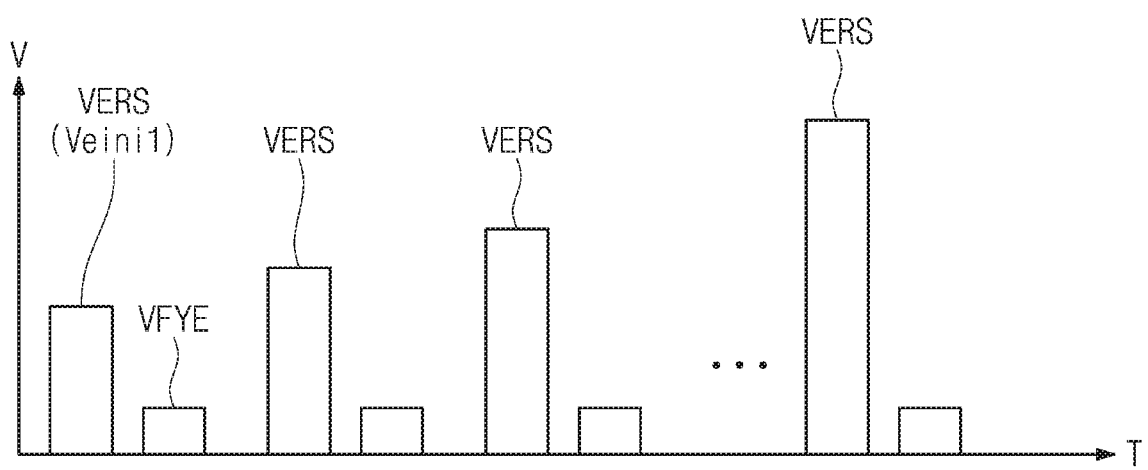
FIG. 15 is a diagram illustrating an example of voltages to be applied to memory cells in an erase operation.

FIG. 15 is a diagram illustrating an example of voltages to be applied to memory cells in an erase operation. In an example embodiment, an example of voltages to be applied to memory cells through a substrate is illustrated in FIG. 15.

Referring to FIGS. 2, 14, and 15, the erase operation may include erase loops. Each erase loop may include applying an erase voltage VERS to memory cells and then applying the erase verification voltage VFYE.

The erase voltage VERS which is applied to the memory cells in a first erase loop may be a first initial erase voltage Veini1. Threshold voltages of the memory cells decrease in the case where the erase voltage VERS is applied in each erase loop. The nonvolatile memory device 110 may perform a verification read operation by using the erase verification voltage VFYE. Depending on a result of the verification read operation, the pass-fail check circuit 115 may determine whether the threshold voltages of the memory cells are lower than the erase verification voltage VFYE.

For the purpose of preventing the threshold voltages of the memory cells from exceeding a target threshold voltage range, that is, from being over-erased, the first initial erase voltage Veini1 may be determined in consideration of a fourth voltage V4. For example, when the first initial erase voltage Veini1 is applied to a memory cell having the lowest threshold voltage in a threshold voltage range of the first program state P1, the first initial erase voltage Veini1 may be set such that the threshold voltage of the memory cell does not exceed a threshold voltage range of the erase state "E".

Afterwards, as the erase loops are repeated, the erase voltage VERS may gradually increase. As the erase voltage VERS gradually increases, the memory cells may have threshold voltages belonging to a target threshold voltage range of the erase state "E" without being over-erased.

Figure 16:
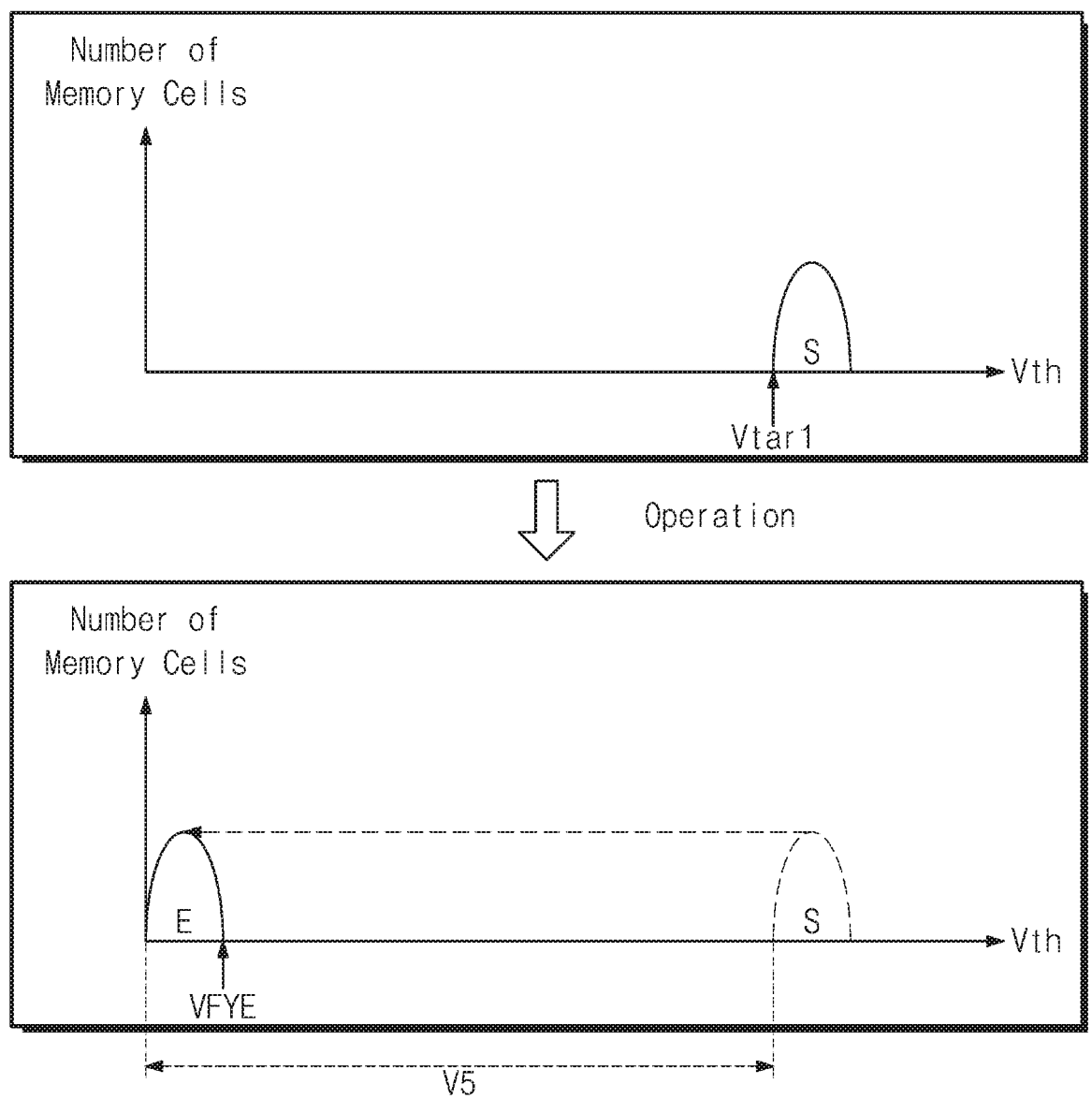
FIG. 16 is a diagram illustrating an example in which threshold voltages of memory cells change when an erase operation is performed in second memory blocks.

FIG. 16 is a diagram illustrating an example in which threshold voltages of memory cells change when an erase operation is performed in the second memory blocks BLKn+1 to BLKz.

Referring to FIG. 16, in FIG. 16, a horizontal axis represents threshold voltages Vth of memory cells, and a vertical axis represents the number of memory cells. For example, when all data stored in one memory block of the second memory blocks BLKn+1 to BLKz are invalid data, the memory block may be erased.

As described with reference to FIG. 8, threshold voltages of the memory cells of a memory block targeted for the erase operation among the second memory blocks BLKn+1 to BLKz may belong to a threshold voltage range corresponding to the sanitize state "S". In the case where the erase operation is performed, the threshold voltages of the memory cells may belong to a threshold voltage range corresponding to the erase state "E".

The erase operation may be performed by using the erase verification voltage VFYE. The erase operation may allow the threshold voltages of the memory cells to be lower than the erase verification voltage VFYE. When the threshold voltages of the memory cells are controlled to be lower than the erase verification voltage VFYE, the erase operation may be completed.

Figure 17:
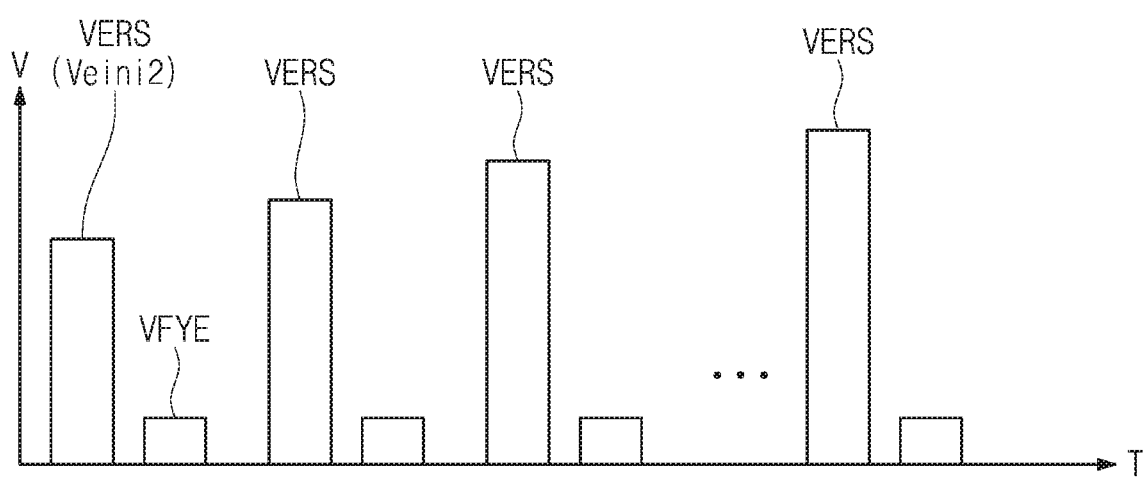
FIG. 17 is a diagram illustrating an example of voltages to be applied to memory cells in an erase operation.

FIG. 17 is a diagram illustrating an example of voltages to be applied to memory cells in an erase operation. In an example embodiment, an example of voltages to be applied to memory cells through a substrate is illustrated in FIG. 17.

Referring to FIGS. 2, 16, and 17, the erase operation may include erase loops. Each erase loop may include applying an erase voltage VERS to memory cells and then applying the erase verification voltage VFYE.

An erase voltage VERS which is applied to the memory cells in a first erase loop may be a second initial erase voltage Veini2. Threshold voltages of the memory cells decrease when the erase voltage VERS is applied in each erase loop. The nonvolatile memory device 110 may perform a verification read operation by using the erase verification voltage VFYE. Depending on a result of the verification read operation, the pass-fail check circuit 115 may determine whether the threshold voltages of the memory cells are lower than the erase verification voltage VFYE.

For the purpose of preventing the threshold voltages of the memory cells from exceeding the target range, that is, from being over-erased, the second initial erase voltage Veini2 may be determined in consideration of a fifth voltage V5. For example, when the second initial erase voltage Veini2 is applied to a memory cell having the lowest threshold voltage in a threshold voltage range of the sanitize state "S", the second initial erase voltage Veini2 may be set such that the threshold voltage of the memory cell does not exceed a threshold voltage range of the erase state "E".

In an example embodiment, the fifth voltage V5 may be higher than the fourth voltage V4 described with reference to FIG. 14. Accordingly, the second initial erase voltage Veini2 for the erase operation of the second memory blocks BLKn+1 to BLKz may be higher than the first initial erase voltage Veini1 for the erase operation of the first memory blocks BLK1 to BLKn.

As in the above description, threshold voltages of memory cells of a memory block targeted for the erase operation may have states described with reference to FIG. 11. In this case, also, the second initial erase voltage Veini2 for the erase operation of the second memory blocks BLKn+1 to BLKz may be higher than the first initial erase voltage Veini1 for the erase operation of the first memory blocks BLK1 to BLKn.

Afterwards, as the erase loops are repeated, the erase voltage VERS may gradually increase. As the erase voltage VERS gradually increases, the memory cells may have threshold voltages belonging to a target threshold voltage range of the erase state "E" without being over-erased.

In an example embodiment, since the second initial erase voltage Veini2 is higher than the first initial erase voltage Veini1, the number of erase loops of the erase operation associated with the second memory blocks BLKn+1 to BLKz may be smaller than the number of erase loops of the erase operation associated with the first memory blocks BLK1 to BLKn.

Figure 18:
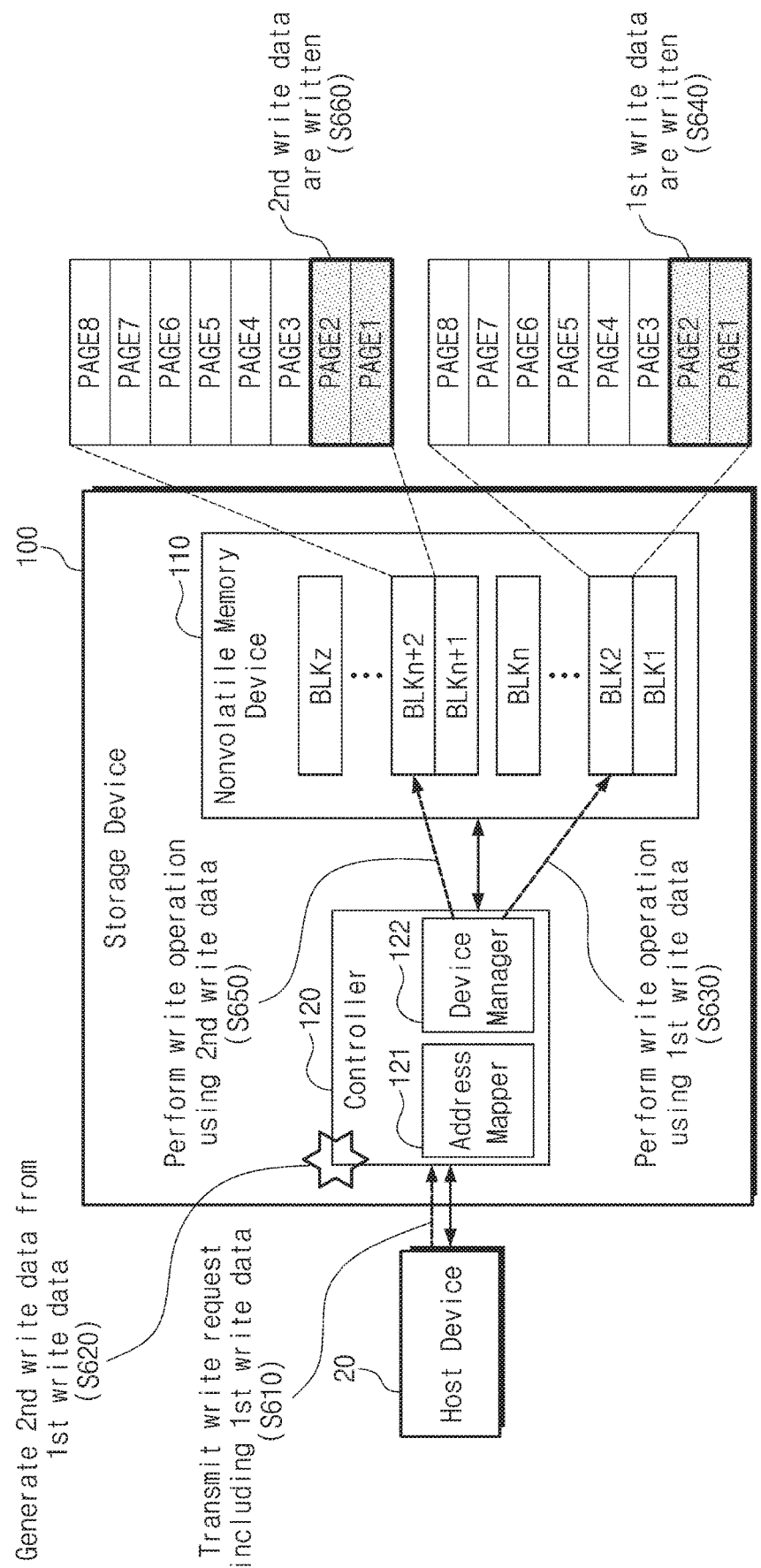
FIG. 18 is a diagram illustrating an example in which a storage device writes data to first memory blocks and second memory blocks depending on a request of a host device.

FIG. 18 is a diagram illustrating an example in which the storage device 100 writes data to the first memory blocks BLK1 to BLKn and the second memory blocks BLKn+1 to BLKz depending on a request of the host device 20.

Referring to FIG. 18, in operation S610, the host device 20 may transmit the write request to the controller 120. The write request may include the first write data.

In operation S620, the controller 120 may generate second write data from the first write data. For example, the controller 120 may generate hash data of the first write data or a portion of the hash data as the second write data. The controller 120 may identify the first write data as a value and the second data as a key. The second write data may indicate a specific storage space of the first memory blocks BLK1 to BLKn.

In operation S630, the controller 120 may perform the write operation on the first memory blocks BLK1 to BLKn by using the first write data. For example, the controller 120 may transmit the write command and physical addresses of a storage space, which the second write data indicate, of the first memory blocks BLK1 to BLKn, for example, physical addresses of the first page PAGE1 and the second page PAGE2 of the second memory block BLK2 to the nonvolatile memory device 110 along with the first write data.

In response to the write command, in operation S640, the first write data may be written to the first page PAGE1 and the second page PAGE2 of the second memory block BLK2.

In operation S650, the controller 120 may perform the write operation on the second memory blocks BLKn+1 to BLKz by using the second write data.

For example, the controller 120 may perform the write operation on the first page PAGE1 and the second page PAGE2 of the (n+2)-th memory block BLKn+2 of the second memory blocks BLKn+1 to BLKz. In response to the write command, in operation S660, the second write data may be written to the first page PAGE1 and the second page PAGE2 of the (n+2)-th memory block BLKn+2.

Figure 19:
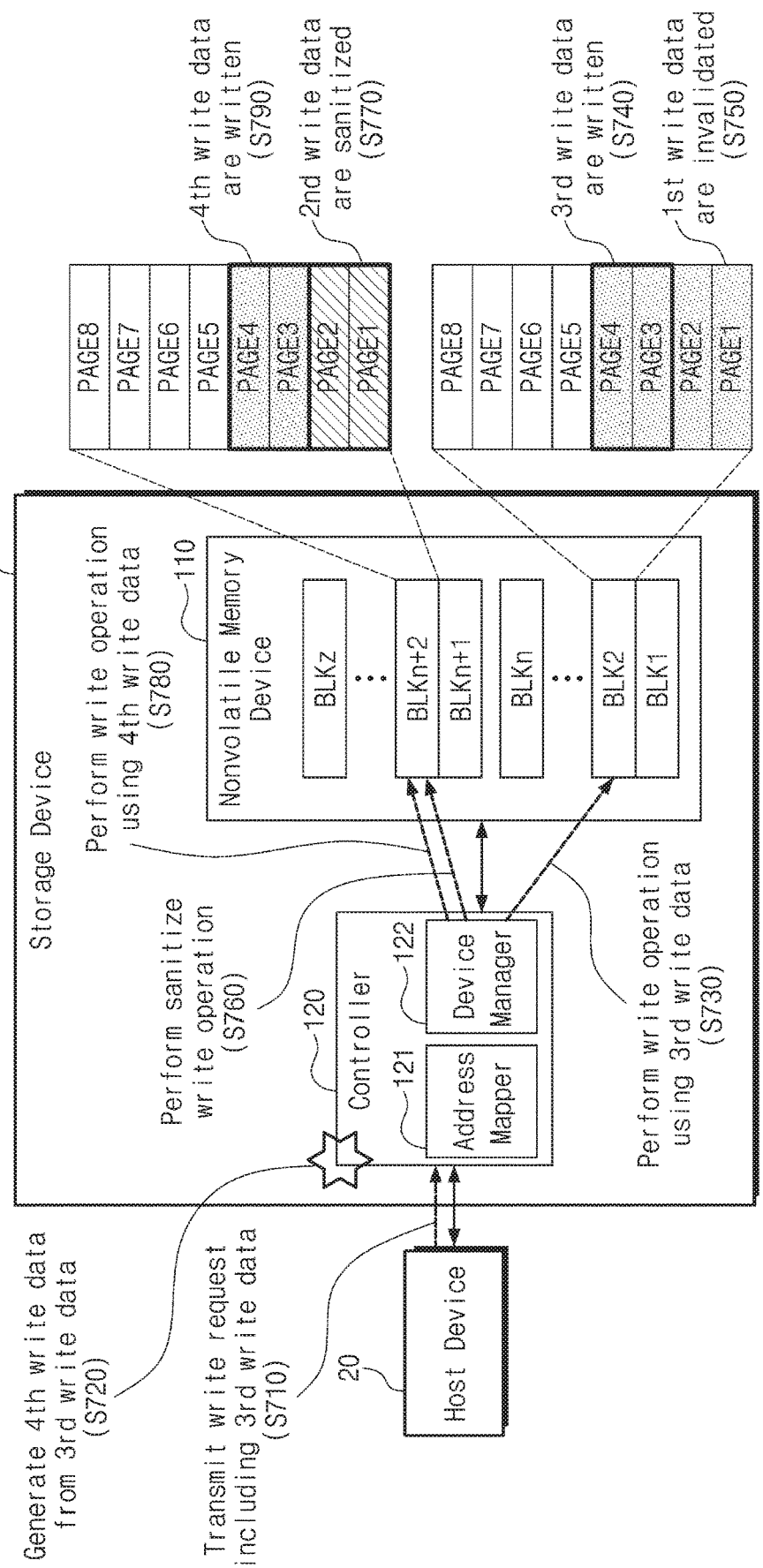
FIG. 19 is a diagram illustrating an example in which a storage device updates data written to first memory blocks and second memory depending on a request of a host device.

FIG. 19 is a diagram illustrating an example in which the storage device 100 updates data written to the first memory blocks BLK1 to BLKn and the second memory blocks BLKn+1 to BLKz depending on a request of the host device 20.

Referring to FIG. 19, in operation S710, the host device 20 may transmit the write request to the controller 120. The write request may include third write data. For example, the third write data may be data for updating the first write data.

In operation S720, the controller 120 may generate fourth write data from the third write data. Operation S720 may be performed the same as operation S620. In operation S730, the controller 120 may perform the write operation on the first memory blocks BLK1 to BLKn by using the third write data. In operation S740, the third write data may be written to the third page PAGE3 and the fourth page PAGE4 of the second memory block BLK2 indicated by the fourth write data.

Since the third write data are data for updating the first write data, in operation S750, the controller 120 may invalidate the first write data. For example, the first write data may be maintained in the first page PAGE1 and the second page PAGE2 of the second memory block BLK2. The controller 120 may store a flag or mark providing notification that the first write data are invalid data, or may release mapping between physical addresses and logical addresses associated with the first write data.

Since the third write data are data for updating the first write data, the fourth write data may be data for updating the second write data. Accordingly, in operation S760, the controller 120 may perform the sanitize write operation on the second write data written to the (n+2)-th memory block BLKn+2. In operation S770, the second write data written to the first page PAGE1 and the second page PAGE2 of the (n+2)-th memory block BLKn+2 may be sanitized.

In operation S780, the controller 120 may perform the write operation on the (n+2)-th memory block BLKn+2 by using the fourth write data. In operation S790, the fourth write data may be written to the third page PAGE3 and the fourth page PAGE4 of the (n+2)-th memory block BLKn+2.

Figure 20:
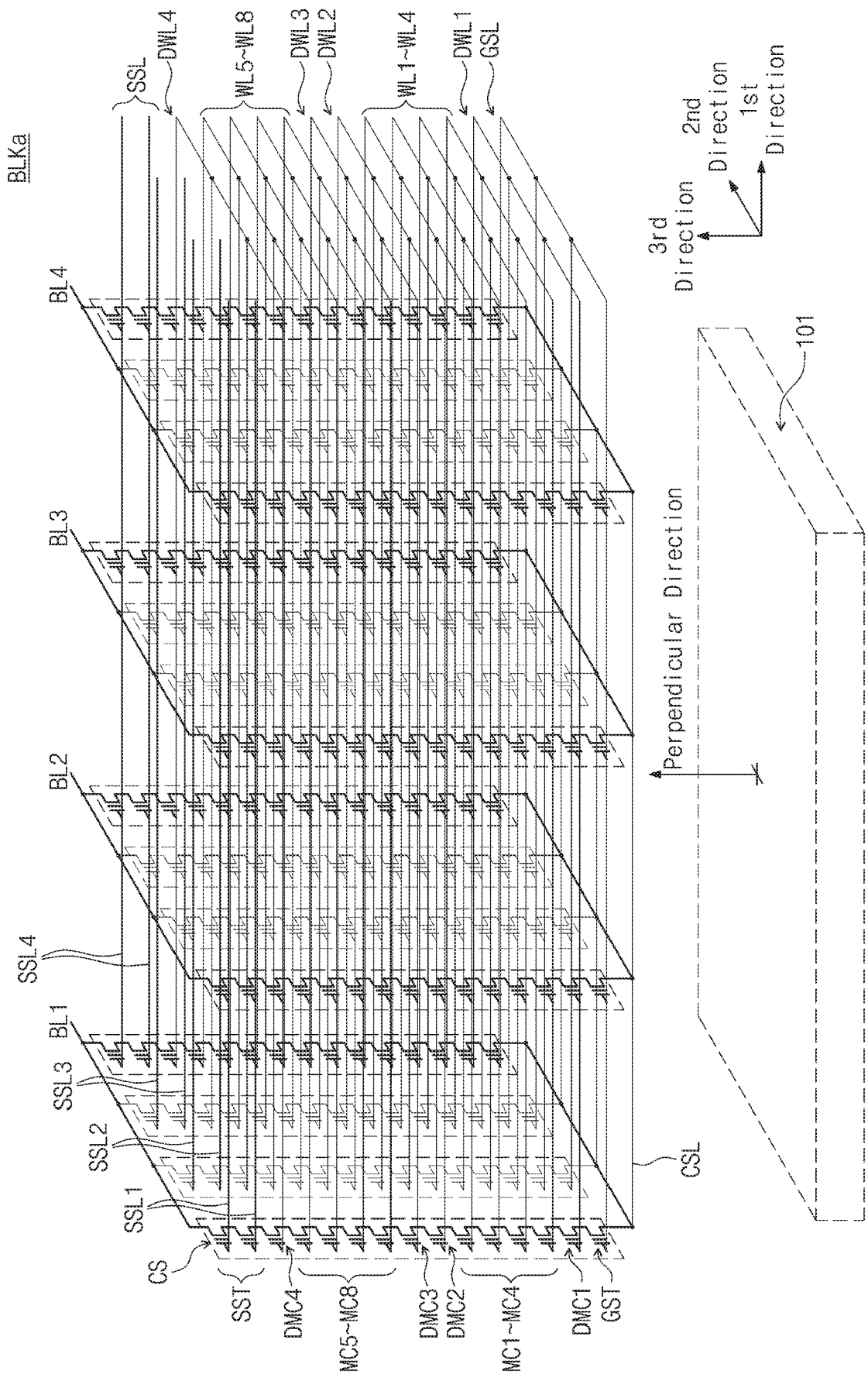
FIG. 20 is a circuit diagram illustrating an example of one memory block of memory blocks of FIGS. 1 and 2.

FIG. 20 is a circuit diagram illustrating an example of one memory block BLKa of the memory blocks BLK1 to BLKz of FIGS. 1 and 2.

Referring to FIG. 20, a plurality of cell strings CS may be arranged on a substrate 101 in a first direction (e.g., a row direction) and a second direction (e.g., a column direction).

The plurality of cell strings CS may be connected to first to fourth word lines BL1 to BL4 extending in the second direction. Cell strings CS belonging to the same column may be connected to the same bit line. The plurality of cell strings CS may include cell transistors stacked in a third direction (e.g., a height direction) perpendicular to the substrate 101.

For example, in each cell string CS, the cell transistors may be used as a ground selection transistor GST, dummy memory cells DMC1 to DMC4, memory cells MC1 to MC8, and string selection transistors SST. For example, the cell transistors may have the same structure.

The ground selection transistor GST may be connected to a ground selection line GSL. The dummy memory cells DMC1 to DMC4 may be connected to dummy word lines DWL1 to DWL4. The memory cells MC1 to MC8 may be connected to word lines WL1 to WL8. The string selection transistors SST may be connected to string selection lines SSL1 to SSL4. In an example embodiment, as in the string selection transistors SST, ground selection transistors in the same row may be connected to the same ground selection line, and ground selection transistors in different rows may be connected to different ground selection lines.

Ground selection transistors in the same row may be connected to the same ground selection line. Memory cells or dummy memory cells having the same height in the third direction from the substrate 101 may be connected to the same word line or the same dummy word line. String selection transistors, which have the same height in the third direction and belong to the same row, may be connected to the same string selection line.

In an example embodiment, memory cells that are located at the same height and are associated with one string selection line SSL1, SSL2, SSL3, or SSL4 may form one physical page. Memory cells of one physical page may be connected to one sub-word line. Sub-word lines of physical pages located at the same height may be connected in common to one word line.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an example embodiment of the inventive concepts, the 3D memory array includes vertical cell strings CS (or NAND strings) that are vertically oriented such that at least one memory cell is located over another memory cell. The at least one memory cell may comprise a charge trap layer. Each cell string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As described with reference to FIG. 20, the memory blocks BLK1 to BLKz may be manufactured to have a three-dimensional structure. In the case where the memory blocks BLK1 to BLKz are manufactured to have a three-dimensional structure, the number of memory cells included in each memory block increases.

Upon updating data written to the second memory blocks BLKn+1 to BLKz, an erase operation may be performed on a memory block storing previous data for the purpose of sanitizing the previous data to be difficult (or, alternatively, impossible) to read. The above manner may apply an erase stress to memory cells included in each memory block.

In the case where the erase stress is accumulated, the lifespan of each memory block is worn out. In particular, as the number of memory cells of each memory block increases due to the three-dimensional structure, the storage capacity which is lost due to the erase stress is increasing.

According to an example embodiment of the inventive concepts, a sanitize write operation may be performed instead of an erase operation for the purpose of sanitizing previous data written to the second memory blocks BLKn+1 to BLKz so as to be difficult (or, alternatively, impossible) to read. This means that the erase stress decreases. Accordingly, the lifespan of the nonvolatile memory device 110 and the storage device 100 is extended.

According to example embodiments of the inventive concepts, upon updating data written to a security memory block, a storage device performs a sanitize write operation on previous data, instead of performing an erase operation on the security memory block. Afterwards, the storage device performs a write operation by using update data. Since the number of erase operations associated with the security memory block decreases, the storage device having an improved lifespan is provided.

The units and/or devices described above, such as the components of the storage device (e.g., 100) including the controller (e.g., 120) and the nonvolatile memory device 110 as well as the sub-components thereof including elements of the address mapper (e.g., 121), device manager (e.g., 122) pass-fail check (PFC) circuit (e.g., 115) and control logic circuit (e.g., 116) may be implemented using hardware, a combination of hardware and software, or a non-transitory storage medium storing software that is executable to perform the functions of the same.

Hardware may be implemented with various hardware devices, such as integrated circuits (ICs), application specific ICs (ASICs), field programmable gate array (FPGAs), complex programmable logic device (CPLDs), system on chips (SoCs) or processing circuity such as one or more Central Processing Units (CPUs), one or more controllers, one or more arithmetic logic units (ALUs), one or more digital signal processors (DSPs), one or more microcomputers, or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein.

The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/ DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments of the inventive concepts have been described with reference to some example embodiments thereof, it will be apparent to those of ordinary skill in the art that various changes and modifications may be made thereto without departing from the spirit and scope of example embodiments of the inventive concepts as set forth in the following claims.

What is claimed is:

1. A storage device comprising:
    a controller configured to,
        receive a first write request from an external host device,
        determine whether the first write request is associated with a security write operation or a non-security write operation,
        selectively transmit a first sanitize command, in response to determining that the first write request is associated with the security write operation, and
        transmit first write data and a first write command, the first write command being associated with the first write request; and
    a nonvolatile memory device including memory blocks having memory cells associated therewith, the nonvolatile memory device configured to,
        selectively sanitize a first data previously written to first memory cells of a first memory block of the memory blocks in response to the first sanitize command received from the controller, and
        write the first write data to second memory cells of the first memory block in response to the first write command received from the controller such that the nonvolatile memory device writes the first write data without sanitizing the first data in response to the first write request being associated with the non-security write operation.

2. The storage device of claim 1, wherein threshold voltages of the first memory cells are distributed to at least four threshold voltage ranges depending on data written to the first memory cells, and wherein, in response to the first sanitize command, the nonvolatile memory device is configured to sanitize the first data by performing a sanitize write operation on the first memory cells, the sanitize write operation including increasing threshold voltages of ones of the first memory cells corresponding to at least one threshold voltage range of the at least four threshold voltage ranges.

3. The storage device of claim 1, wherein threshold voltages of the first memory cells are distributed to at least four threshold voltage ranges depending on data written to the first memory cells, and wherein, in response to the first sanitize command, the nonvolatile memory device is configured to perform a sanitize write operation on the first memory cells, the sanitize write operation including increasing the threshold voltages of the first memory cells to a highest threshold voltage range of the at least four threshold voltage ranges.

4. The storage device of claim 1, wherein, in response to the first sanitize command, the nonvolatile memory device performs a sanitize write operation on the first memory cells of the first memory block, and Wherein the sanitize write operation includes program loops, the program loops of the sanitize write operation including,
    applying a program voltage to the first memory cells; and
    applying one verification voltage to the first memory cells.

5. The storage device of claim 1, wherein, in response to the first sanitize command, the nonvolatile memory device performs a sanitize write operation on the first memory cells of the first memory block, wherein the sanitize write operation includes program loops, the program loops of the sanitize write operation including,
    applying a program voltage to the first memory cells such that, in the program loops, a verification voltage is not applied to the first memory cells.

6. The storage device of claim 5, wherein the nonvolatile memory device is configured to end the sanitize write operation when the program loops are performed a threshold number of times.

7. The storage device of claim 1, wherein the controller is configured to,
    receive a second write request from the external host device,
    transmit, to the nonvolatile memory device, a second sanitize command for the second memory cells of the first memory block, in response to the second write request, and
    transmit, to the nonvolatile memory device, second write data and a second write command associated with the second write request in response to a storage capacity of the first memory block being sufficient, such that the nonvolatile memory device performs a write operation on third memory cells of the first memory block.

8. The storage device of claim 1, wherein the controller is configured to,
    receive a second write request from the external host device,
    transmit, to the nonvolatile memory device, a second sanitize command for the second memory cells of the first memory block, in response to the second write request, and
    transmit, to the nonvolatile memory device, second write data and a second write command associated with the second write request in response to a storage capacity of the first memory block being insufficient, such that the nonvolatile memory device performs a write operation on third memory cells of a second memory block of the memory blocks.

9. The storage device of claim 1, wherein the controller is configured to,
receive a second write request from the external host device,
transmit, to the nonvolatile memory device, second write data and a second write command in response to second write data associated with the second write request not being data for updating the first write data, such that the nonvolatile memory device performs a write operation on third memory cells of a second memory block of the memory blocks.

10. The storage device of claim 9, wherein the controller is configured to,
receive a third write request from the external host device,
transmit, to the nonvolatile memory device, a second sanitize command for the third memory cells of the second memory block in response to third write data associated with the third write request being data for updating the second write data, and
transmit, to the nonvolatile memory device, the third write data and a third write command in response to a storage capacity of the second memory block being sufficient, such that the nonvolatile memory device performs a write operation on fourth memory cells of the second memory block of the nonvolatile memory device.

11. The storage device of claim 1, wherein
the nonvolatile memory device further includes user memory blocks, the user memory blocks each including user memory cells,
the first write request includes second write data, and
when the second write data are data for updating second data previously stored in a first user memory block of the user memory blocks, the controller is configured to transmits the second write data and a second write command to the nonvolatile memory device in response to the first write request such that the nonvolatile memory device performs a write operation on a second user memory block of the user memory blocks, and identifies the second data as invalid data.

12. The storage device of claim 11, wherein the controller is configured to maintain the second data in the first user memory block until the first user memory block is erased.

13. The storage device of claim 11, wherein the controller generates the first write data from the second write data in response to the first write request.

14. The storage device of claim 11, wherein the nonvolatile memory device is configured to,
perform a sanitize write operation on the first memory cells of the first memory block in response to the first sanitize command, the sanitize write operation including first program loops, the first program loops including applying a first program voltage to the first memory cells,
perform a write operation on first user memory cells of the first user memory block in response to the second write command, the write operation including second program loops, the second program loops including applying a second program voltage to the first user memory cells, and wherein
an initial level of the first program voltage is higher than an initial level of the second program voltage, and the first program voltage and the second program voltage gradually increase.

15. The storage device of claim 14, wherein
each of the first program loops further includes applying one verification voltage, and
each of the second program loops further includes sequentially applying at least three verification voltages.

16. The storage device of claim 11, wherein
the controller is configured to transmit a first erase command to erase the first memory block and a second erase command to erase the first user memory block,
the nonvolatile memory device is configured to,
perform a first erase operation on memory cells of the first memory block in response to the first erase command, the first erase operation including first erase loops, the first erase loops including applying a first erase voltage to the second memory cells, and
perform a second erase operation on user memory cells of the first user memory block in response to the second erase command, the second erase operation including second erase loops, each of the second erase loops including applying a second erase voltage to first user memory cells of the first user memory block, and wherein
an initial level of the first erase voltage is higher than an initial level of the second erase voltage, and the first erase voltage and the second erase voltage gradually increase.

17. A storage device comprising:
a nonvolatile memory device including first memory blocks and second memory blocks; and
a controller configured to differently manage data written to the first memory blocks and the second memory blocks based on whether the data is associated with a security write operation or a non-security write operation by,
selectively transmitting, to the nonvolatile memory device, a sanitize command associated with first data previously written to the first memory blocks and a write command for first update data upon updating the first data, in response to the first data or the first update date being associated with the security write operation, the sanitize command instructing the nonvolatile memory device to increase threshold voltages of first memory cells in a first memory block selected from the first memory blocks, and
transmitting, to the nonvolatile memory device, a write command associated with second update data upon updating second data written to the second memory blocks, in response to the second data or the second update data being associated with the non-security write operation such that the nonvolatile memory device writes the second update data without sanitizing the second data.

18. The storage device of claim 17, wherein the controller is configured to write the first update data to second memory cells of the first memory block.

19. A storage device comprising:
a nonvolatile memory device including memory blocks each including memory cells; and
a controller configured to, update first data previously written to a first memory block of the memory blocks using second data by,
determining whether the first data is associated with a security write operation or a non-security write operation,
selectively transmitting a sanitize command for the first data stored in the first memory block to the nonvolatile memory device, in response to the first data being associated with the security write operation, the sanitize command instructing the nonvolatile memory device to sanitize the first data such that after the first data are sanitized, the first data that has been sanitized occupies a capacity of the first memory block as invalid data, and transmitting a write command for the second data to the nonvolatile memory device such that a write operation is performed on the first memory block or a second memory block of the memory blocks such that the nonvolatile memory device writes the second data without sanitizing the first data in response to the first data or the second data being associated with the non-security write operation.

20. The storage device of claim 19, wherein, the controller is configured to transmit an erase command for the first memory block to the nonvolatile memory device in response to a storage capacity of the first memory block being insufficient.

* * * * *